(12) United States Patent
Li et al.

(10) Patent No.: US 11,687,010 B2
(45) Date of Patent: Jun. 27, 2023

(54) SYSTEM AND METHOD FOR CORRECTING OVERLAY ERRORS IN A LITHOGRAPHIC PROCESS

(71) Applicant: ONTO INNOVATION, INC., Wilmington, MA (US)

(72) Inventors: Zhiyang Li, Lowell, MA (US); Tong Yang, Lowell, MA (US)

(73) Assignee: Onto Innovation Inc., Wilmington, MA (US)

( * ) Notice: Subject to any disclaimer, the term of this patent is extended or adjusted under 35 U.S.C. 154(b) by 0 days.

(21) Appl. No.: 17/180,624

(22) Filed: Feb. 19, 2021

(65) Prior Publication Data

US 2021/0263427 A1  Aug. 26, 2021

Related U.S. Application Data

(60) Provisional application No. 62/979,635, filed on Feb. 21, 2020.

(51) Int. Cl.
| | | |
|---|---|---|
| G03F 7/20 | (2006.01) | |
| G03F 7/00 | (2006.01) | |
| H01L 21/68 | (2006.01) | |

(52) U.S. Cl.
CPC ...... G03F 7/70633 (2013.01); G03F 7/70525 (2013.01); H01L 21/682 (2013.01)

(58) Field of Classification Search
CPC ............ G03F 7/70633; G03F 7/70525; G03F 9/7019; G03F 1/36; G03F 7/705;
(Continued)

(56) References Cited

U.S. PATENT DOCUMENTS

| | | |
|---|---|---|
| 3,434,787 A | 3/1969 | Chitayat |
| 3,495,512 A | 2/1970 | Vaughan |
| (Continued) | | |

FOREIGN PATENT DOCUMENTS

| | | |
|---|---|---|
| EP | 0341848 B1 | 1/1995 |
| JP | S60-47418 A | 3/1985 |
| (Continued) | | |

OTHER PUBLICATIONS

Examination Report dated Nov. 17, 2020, in connection with Taiwan Patent Application No. 107134488, filed Sep. 28, 2018, 7 pgs.

(Continued)

*Primary Examiner* — Mesfin T Asfaw

(74) *Attorney, Agent, or Firm* — Schwegman Lundberg & Woessner, P.A.

(57) ABSTRACT

As feature sizes of semiconductor chips shrink there is a need for tighter overlay between layers in a lithography process. This means more advanced and larger overlay corrections may be necessary to ensure that die are properly manufactured into chips, especially in reconstituted substrates where the die can shift in the process of creating the substrate. Systems and methods for correcting these overlay errors in a lithographic process are provided. Additional rotation (theta) and projected image size (mag) corrections can be made to correct overlay errors present in reconstituted substrates by adjusting the stage and the reticle. Furthermore, these adjustments can be made allowing site-by-site or zone-by-zone corrections instead of a one-time adjustment of the reticle chuck as has been done in the past. These corrections can alleviate some of the issues associated with fan-out wafer-level packaging (FOWLP) and fan-out panel-level packaging (FOPLP).

17 Claims, 17 Drawing Sheets

(58) Field of Classification Search
CPC ............ G03F 7/70258; G03F 7/70725; G03F 9/7046; H01L 21/682; H01L 22/12
See application file for complete search history.

(56) References Cited

U.S. PATENT DOCUMENTS

| | | | |
|---|---|---|---|
| 3,498,711 | A | 3/1970 | Ables et al. |
| 3,539,256 | A | 11/1970 | Ables |
| 3,544,213 | A | 12/1970 | Jaeger et al. |
| 3,563,648 | A | 2/1971 | Baggaley et al. |
| 4,473,293 | A | 9/1984 | Phillips |
| 4,488,806 | A | 12/1984 | Takahashi et al. |
| 4,556,317 | A | 12/1985 | Sandland et al. |
| 4,631,416 | A | 12/1986 | Trutna |
| 4,668,089 | A | 5/1987 | Oshida et al. |
| 4,769,680 | A | 9/1988 | Resor, III et al. |
| RE33,836 | E | 3/1992 | Resor et al. |
| 5,506,684 | A | 4/1996 | Ota et al. |
| 5,621,813 | A | 4/1997 | Brown et al. |
| 5,633,755 | A | 5/1997 | Manabe et al. |
| 5,677,758 | A | 10/1997 | McEachern et al. |
| 5,757,160 | A | 5/1998 | Kreuzer |
| 5,828,142 | A | 10/1998 | Simpson |
| 5,933,216 | A | 8/1999 | Dunn |
| 5,969,441 | A | 10/1999 | Loopstra et al. |
| 6,166,392 | A | 12/2000 | Chang et al. |
| 6,171,736 | B1 | 1/2001 | Hirayanagi |
| 6,238,852 | B1 | 5/2001 | Klosner |
| 6,269,322 | B1 | 7/2001 | Templeton et al. |
| 6,331,885 | B1 | 12/2001 | Nishi |
| 6,341,007 | B1 | 1/2002 | Nishi et al. |
| 6,525,804 | B1 | 2/2003 | Tanaka |
| 6,624,879 | B2 | 9/2003 | Imai |
| 6,734,971 | B2 | 5/2004 | Smith et al. |
| 6,843,572 | B2 | 1/2005 | Shiraishi |
| 7,342,641 | B2 | 3/2008 | Sogard |
| 7,385,671 | B2 | 6/2008 | Gardner et al. |
| 8,164,736 | B2 | 4/2012 | Shibazaki |
| 8,299,446 | B2 | 10/2012 | Hawryluk et al. |
| 9,195,149 | B2 | 11/2015 | Chung |
| 9,541,845 | B2 | 1/2017 | Omameuda |
| 10,031,429 | B2 | 7/2018 | Endo et al. |
| 10,712,671 | B2 | 7/2020 | Binnard |
| 2002/0145716 | A1 | 10/2002 | Kurosawa |
| 2003/0218730 | A1 | 11/2003 | Murakami et al. |
| 2004/0026634 | A1 | 2/2004 | Utsumi et al. |
| 2004/0043311 | A1 | 3/2004 | McCullough et al. |
| 2004/0067420 | A1 | 4/2004 | Ota |
| 2004/0157143 | A1 | 8/2004 | Taniguchi |
| 2006/0007431 | A1* | 1/2006 | Smith ............... G03F 7/70358 356/150 |
| 2006/0238761 | A1 | 10/2006 | Lin et al. |
| 2007/0279607 | A1 | 12/2007 | Smith et al. |
| 2008/0013089 | A1 | 1/2008 | Ishii et al. |
| 2008/0050040 | A1 | 2/2008 | Geers et al. |
| 2008/0106714 | A1 | 5/2008 | Okita |
| 2009/0128832 | A1 | 5/2009 | van Bilsen et al. |
| 2010/0073663 | A1 | 3/2010 | Meyer |
| 2011/0038704 | A1 | 2/2011 | Hawryluk et al. |
| 2015/0363536 | A1 | 12/2015 | Chidambarrao et al. |
| 2016/0077521 | A1 | 3/2016 | Chung |
| 2016/0091800 | A1 | 3/2016 | Sasaki |
| 2018/0330999 | A1 | 11/2018 | Lee et al. |
| 2020/0233320 | A1 | 7/2020 | Da Silveira et al. |
| 2020/0266087 | A1 | 8/2020 | Ichinose et al. |
| 2020/0356012 | A1 | 11/2020 | Mos et al. |

FOREIGN PATENT DOCUMENTS

| | | |
|---|---|---|
| JP | S63-261850 A | 10/1988 |
| KR | 101679932 B1 | 11/2016 |
| TW | 200620407 A | 6/2006 |
| TW | 200623232 A | 7/2006 |
| TW | 201142978 A | 12/2011 |
| WO | 2017108453 A1 | 6/2017 |
| WO | 2020200635 A1 | 10/2020 |
| WO | 2021168359 | 8/2021 |

OTHER PUBLICATIONS

International Search Report and Written Opinion dated Jun. 25, 2019, in connection with International Patent Application No. PCT/US2018/053254, filed Sep. 28, 2018, 22 pgs.

Invitation to Pay Additional Fees dated Apr. 23, 2019, in connection with International Patent Application No. PCT/US2018/053254, filed Sep. 28, 2018, 14 pgs.

Yang et al., "Photolithography Solution That Overcomes Significant Die Placement Error for Advanced Packaging," 2020, IEEE 70th Electronic Components and Technology Conference (ECTC), pp. 315-320.

McCleary et al., "Panel Level Advanced Packaging," 2016, IEEE 66th Electronic Components and Technology Conference (ECTC), pp. pp. 25-30.

J. D. Armitage et al., "Analysis of Overlay Distortion Patterns," 1988, Proc. SPIE 0921, Integrated Circuit Metrology, Inspection, and Process Control II, pp. 207-222.

"International Application Serial No. PCT US2021 018916, International Search Report dated Jun. 15, 2021", 3 pgs.

"International Application Serial No. PCT US2021 018916, Written Opinion dated Jun. 15, 2021", 4 pgs.

"International Application Serial No. PCT/US2021/018916, International Preliminary Report on Patentability dated Sep. 1, 2022", 6 pgs.

* cited by examiner

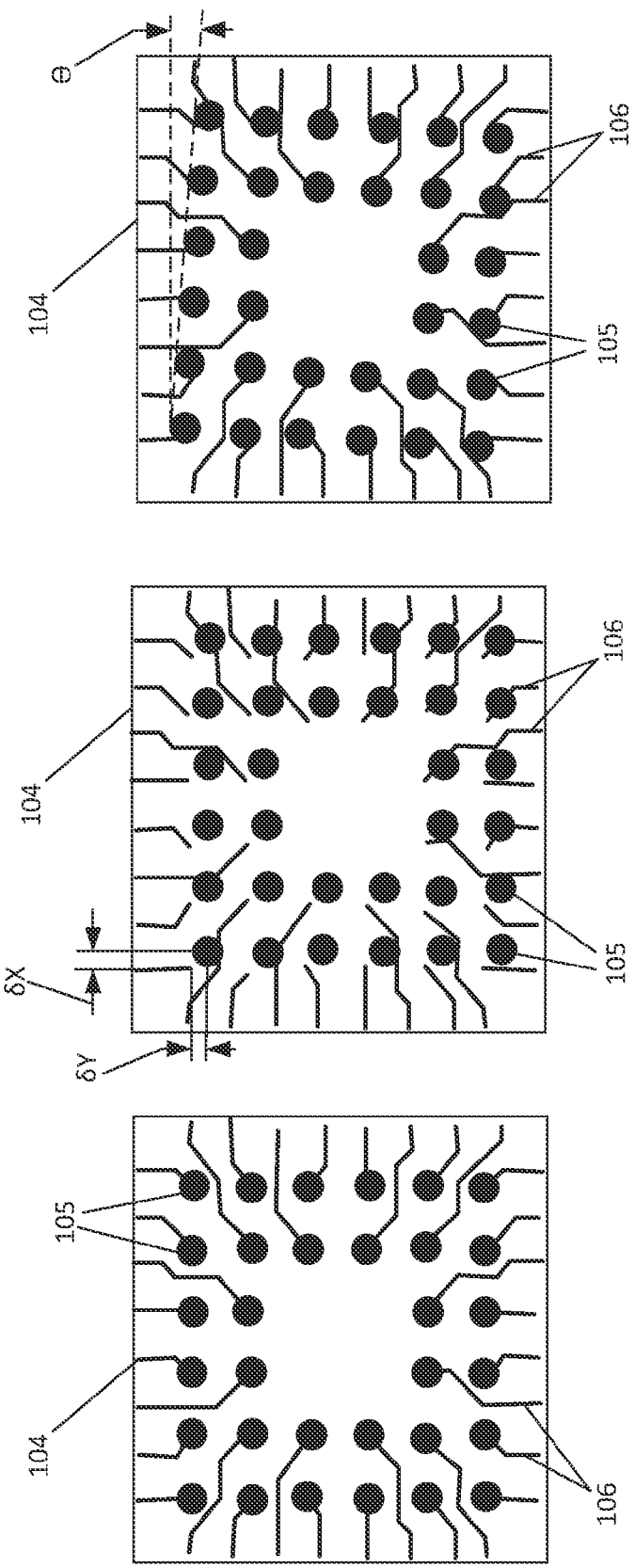

SYSTEM AND METHOD FOR CORRECTING OVERLAY ERRORS IN A LITHOGRAPHIC PROCESS

This application claims the benefit of U.S. Provisional Application No. 62/979,635, entitled Extended Theta and Mag Correction in Lithography, filed Feb. 21, 2020, the disclosure of which is incorporated herein by reference in its entirety.

TECHNICAL FIELD

The present disclosure relates generally to fabricating semiconductor devices and more particularly to a method for correcting overlay errors in a lithographic process.

BACKGROUND

Semiconductor devices are an essential component of modern electronic and computing devices. Semiconductors devices are electronic components that exploit the electrical properties of semiconductor materials. The electrical conductivity of semiconductor materials can be manipulated by the introduction of an electric or magnetic field. The performance of semiconductor materials can be improved by optimizing the lithography processing techniques. Improvements in the manufacturing process have resulted in exponential improvements in the size, speed, and cost of semiconductor devices. However, there continues to be demand for faster, more reliable, and higher performing semiconductor devices.

In a typical semiconductor manufacturing process, bare whole wafers or panels are processed using lithographic techniques to create circuitry thereon. These substrates with circuitry are often then separated into smaller pieces known as dies. These dies form the basis of common electronic devices. However, during the semiconductor manufacturing process, overlay errors in the lithographic processes may occur. These overlay errors may be essentially random, e.g., the result of environmental factors such as temperature or atmospheric pressure change, or may be a result of systematic factors such as consistent positioning errors associated with a pick and place system.

Overlay errors in lithographic processes can cause drops in the yield of a process and can also lead to reduced system throughputs or even product malfunction. Failure to properly correct for overlay errors can lead to failed electronic devices where dies do not function or where they fail prematurely. Yield, which is defined as the number of good quality dies coming out of a process divided by the total number of dies that undergo the process, directly affects the revenue that a manufacturer can expect to obtain. Lower yields or yields that reflect lower quality will reduce the amount of revenue a manufacturer can command for a product. As such, there is a need for better correction factors to improve the yields.

BRIEF SUMMARY OF THE INVENTION

In accordance with one or more embodiments, systems and methods for improving the quality of integrated circuit devices is described herein. As feature sizes of semiconductor chips shrink there is a need for tighter overlay between layers in a lithography process. This means more advanced and larger overlay corrections may be necessary to ensure that die are properly manufactured into chips, especially in reconstituted substrates where the die can shift in the process of creating the substrate. Systems and methods for correcting these overlay errors in a lithographic process are provided. Additional rotation (theta) and projected image size (mag) corrections can be made to correct overlay errors present in reconstituted substrates by adjusting the stage and the reticle. Furthermore, these adjustments can be made allowing site-by-site or zone-by-zone corrections instead of a one-time adjustment of the reticle chuck as has been done in the past. These corrections can alleviate some of the issues associated with fan-out wafer-level packaging (FOWLP) and fan-out panel-level packaging (FOPLP).

In one embodiment, a method includes adjusting a reticle to minimize an overlay error with a substrate between exposures on the substrate; adjusting a stage to minimize the overlay error with the substrate between exposures on the substrate; and exposing the substrate after adjusting the reticle and the stage. This correction using both the reticle and the stage can be done such that the reticle adjustment occurs while the stage is being adjusted. The reticle and stage adjustment can also be done serially.

In another embodiment, a method of correcting overlay errors between layers of a lithography process between exposures is provided including exposing a plurality of devices on a substrate, adjusting a stage to correct X, Y and theta on a second plurality of devices on the substrate based on inspection information, adjusting a reticle chuck to correct mag error in the second plurality of devices on the substrate, and exposing the second plurality of devices on the substrate. The embodiment includes an apparatus for correcting overlay errors between layers of a lithography process between exposures, including a light source that exposes a plurality of devices on a substrate, a stage that adjusts to correct X, Y and theta based on inspection information, a reticle chuck that is adjusted to correct mag error in the second plurality of devices on the substrate, and the light source that exposes the second plurality of devices on the substrate.

In one embodiment, a method of correcting overlay errors between layers of a lithography process between exposures is provided including inspecting a plurality of devices on a substrate to determine a mag error in the plurality of devices and creating mapping information, adjusting a reticle chuck to correct the mag error in the plurality of devices on the substrate based on the mapping information, and exposing the plurality of devices on the substrate. The embodiment includes an apparatus for correcting overlay errors between layers of a lithography process between exposures, including an inspection system that inspects a plurality of devices on a substrate to determine a mag error in the plurality of devices and creates mapping information, a lithography system that includes a reticle chuck that adjusts to correct the mag error in the plurality of devices on the substrate based on the mapping information, and a light source that exposes the plurality of devices on the substrate.

In another embodiment, a method of correcting overlay errors between layers of a lithography process between exposures is provided including exposing a plurality of devices on a substrate, adjusting a reticle chuck to correct mag error in the second plurality of devices on the substrate, and exposing the second plurality of devices on the substrate. The embodiment includes an apparatus for correcting overlay errors between layers of a lithography process between exposures, including a light source that exposes a plurality of devices on a substrate, a reticle chuck that is adjusted to correct mag error in the second plurality of devices on the substrate, and the light source that exposes the second plurality of devices on the substrate.

According to an embodiment, the disclosed method begins with optically inspecting a substrate having a plurality of integrated circuit devices. Devices are identified from the plurality of devices of the substrate that are discrepant, if any. An alignment is determined of each of the plurality of devices relative to the substrate from the results of the optical inspection. The determination of the alignment omits at least some of the devices identified as being discrepant, if any. A recipe is generated for exposing the plurality of devices based at least in part on the inspecting, identifying, and determining steps. Note the term "recipe" is a term of art in the semiconductor industry used to describe the set of instructions and related or supporting information needed to process an integrated circuit device. The recipe includes information on one or more exposure shots, an order for exposing the exposure shots, and a path for moving between at least two of the one or more exposure shots. The recipe is implemented using a lithography system to expose at least a portion of the plurality of devices. The process may be performed repeatedly using the same or different lithographic patterns until a desired structure is satisfactorily formed.

Reducing overlay amongst integrated circuit devices on a substrate, particularly on reconstituted substrates, and accommodating residual misalignments between the devices is an advantage of the techniques described in this disclosure. Advantageously, the determination of alignments of integrated circuit devices relative to their substrate can be obtained as part of a defect inspection process in which images of the integrated circuits are assessed for discrepancies and defects. Careful calibration of the field of view of the imaging device used to conduct the inspection to the mechanical stage on which the substrate is supported provides the localization information needed for alignment purposes.

In one embodiment, the plurality of devices of the substrate may be grouped based on their determined alignment (e.g., to establish a plurality of groups of similarly aligned devices). One or more exposure shots are tiled over each of the respective groups of devices of the substrate. In one example, lithographic patterns that are part of a "shot" are tiled over the respective groups of devices so that the lithographic patterns are well aligned with the devices. The lithographic patterns may have different shapes or arrays. The tiling is characterized by substantially all of the devices exposure by an exposure shot meeting a predetermined alignment criterion. One or more paths are then defined between the one or more exposure shots, thereby establishing the recipe for performing lithographic exposure of the devices.

In one embodiment, substantially all of the devices of a substrate may be exposed by an exposure shot such that alignment between the respective devices and the exposure shots meets a predetermined alignment criterion. The one or more exposure shots tiled over a group may address different numbers of devices and/or may have different shapes.

In one embodiment, a set of initial conditions may be established that includes a set of permissible exposure shots, a grouping of devices on a substrate, and an alignment criterion. The tiling and defining steps are iterated for successive perturbations in the initial conditions. A score is assigned for each iteration of the tiling and defining steps. The score may take into consideration the paths required to move between each of the shots defined by the tilings. For any given tiling, multiple paths may be possible and at least one path will be determined for each tiling. The various combinations of tilings and paths will be scored based on throughput, yield, or some other set of criteria. The recipe is established based on the iteration of the tiling and defining steps having an optimal score. In one embodiment, the successive perturbations in the initial conditions may be modifications selected from a group consisting of a modification in the size of an exposure shot, a modification in an aspect ratio of an exposure shot, a modification of an area of an exposure shot, a modification of a predetermined range of acceptable alignments for defining a group, selection of an initially selected device, selection of a group of initially selected devices, modification of the size of a group of initially selected devices, and modification of the aspect ratio of a group of initially selected devices.

In one embodiment, a set of devices and an exposure shot that nominally would expose all of the selected set of devices may be selected. The exposure shot is fit to a set of the plurality of devices of the substrate. It is determined whether a threshold alignment criterion for alignment of the exposure shot to the selected set of the plurality of devices is met for each of the selected set of devices. The selected exposure shot is established as part of the recipe where the threshold alignment criterion for alignment of the exposure shot to the selected set of the plurality of devices is met for each of the selected set of devices. The selected set of devices is subdivided into one or more subsets where the threshold alignment criterion is not met for a predetermined number of devices of the selected set of devices, the subdivision being made such that a predetermined exposure shot would nominally expose all of the devices in the subset of devices. The fitting, determining, and subdividing steps are repeated until substantially all devices of the substrate are tiled with exposure shots.

In one embodiment, generating a recipe for exposing the plurality of devices includes selecting an exposure shot having a largest area that can be applied to a region of the substrate having a set of devices. The selected exposure shot is fit to the set of devices. A projected yield is computed for the selected exposure shot, the region, and the fitting based on an alignment of the set of devices. It is determined whether the projected yield satisfies an alignment criterion. In response to determining that the projected yield satisfies the alignment criterion, the selected exposure shot is established as part of the recipe. In response to determining that the projected yield does not satisfy the alignment criterion, the selected exposure shot is divided and the steps of selecting, fitting, computing, and determining whether the projected yield satisfies the alignment criterion are repeated until the projected yield satisfies the alignment criterion.

In one embodiment, a recipe for exposing the plurality of devices is generated using dynamic programming techniques. A preexisting exposure shot is selected from a plurality of preexisting exposure shots. Each of the plurality of preexisting exposure shots has a pre-solved field of view size, shape, and orientation. A set of the plurality of devices is compared with the selected preexisting exposure shot. It is determined whether the selected preexisting exposure shot satisfies an alignment criterion for the set of devices. In response to determining that the selected preexisting exposure shot satisfies the alignment criterion for the set of devices, the selected preexisting exposure shot is established as part of the recipe. In response to determining that the selected preexisting exposure shot does not satisfy the alignment criterion for the set of devices, another preexisting exposure shot is selected from the plurality of preexisting exposure shots, and the comparing and the determining whether the selected preexisting exposure shot satisfies the alignment criterion for the set of devices steps are repeated until the alignment criterion is satisfied for the set of devices.

In accordance with another embodiment, the alignment of a plurality of integrated circuit devices relative the substrate of which they are part is determined. The devices are grouped based on the determined alignment of the devices to establish a plurality of groups of devices. Each of the plurality of groups are tiled with one or more arrays of lithographic patterns. A path is defined between each of the tiled arrays of lithographic patterns, thereby establishing a recipe for performing lithographic exposure of the devices. The devices of the substrate are lithographically exposed according to the recipe to form at least a portion of a structure on the devices.

In one embodiment, a misalignment of one or more of the plurality of devices may be determined based on the alignment. The misalignment of the plurality of devices of a subsequent substrate that incorporates the devices may be corrected to reduce misalignment amongst the plurality of devices (e.g., by modifying the operation of the tools used to create the present substrate).

In one embodiment, the plurality of groups of devices may be repeatedly tiled to generate a plurality of distinct tilings. A path is defined for each of the distinct tiling. A score for the combination of each of the distinct tiling and its respective path may be generated that is at least partially based upon the number of arrays of lithographic patterns that are required to cover the plurality of devices and the length of time required to travel along the defined path. A distinct tiling is selected that has an optimal score. The selected tiling is used to establish a recipe.

In one embodiment, the groups of devices may be repeatedly tiled to generate a plurality of distinct tilings. A plurality of paths is defined for each of the distinct tilings. A path is selected for each of the distinct tilings based on a length of time required to travel along the defined path. A score is generated for the combination of each of the distinct tilings and its selected path that is at least partially based upon the number of arrays of the lithographic patterns that are required to cover the plurality of devices and the length of time required to travel along the defined path. A distinct tiling and path are selected that has an optimal score. The selected tiling is used to establish a recipe.

In another embodiment, a method of improving the quality of integrated circuit devices is provided. An alignment is determined of a plurality of devices relative to a substrate of which they are part. A selected group of the devices is fit to an array of lithographic patterns. It is determined whether an alignment of the array of lithographic patterns to the selected group of devices satisfies a predetermined alignment quality. Where the alignment quality is satisfied (e.g., where a high enough percentage of the devices are properly aligned), the array of lithographic patterns is established as a shot for exposing the selected group of the devices. Where the alignment quality is not satisfied, one or more smaller arrays of lithographic patterns are iteratively fit to a subset of the selected group of the devices until the alignment quality is satisfied and shots for exposing the selected group of devices are established. A path is defined between each of the established shots, thereby establishing a recipe for performing lithographic exposure of the devices. The devices of the substrate are exposed to form at least a portion of a structure on the devices.

As above, the alignment measurements of the integrated circuit devices can be used to determine an overlay error of one or more of the plurality of devices. The overlay error may include alignment errors that arose during the creation of the substrate of which the integrated circuit devices are part. The misalignment of a plurality of devices of a subsequent substrate that incorporates the devices may be corrected (e.g., by modifying the operation of the tools used to create the present substrate) to reduce misalignment amongst the plurality of devices.

In one embodiment, the optimization of the creation of a recipe or set of instructions for lithographically exposing a substrate can be approached by fitting devices to a predetermined shot or by fitting shots to groups defined on the basis of alignment. The end goal is the same in either case, i.e. to obtain good quality alignments between a reticle and the devices in an efficient manner. In another embodiment, alignment of a plurality of devices relative to a substrate of which they are part is determined. These devices are then grouped based on the determined alignment of the devices. This establishes a plurality of groups of devices, each device of the group having a similar alignment. Shots or arrays of lithographic patterns of various shapes and sizes are tiled, in the mathematical sense, over the plurality of groups of devices to define the shots for tiling each of the plurality of groups of devices with one or more arrays of lithographic patterns. A path is defined between each of the tiled patterns. The defined shots together with path establish a recipe for performing lithographic exposure of the devices. Once a recipe is in hand, the devices of the substrate are exposed according to the recipe to form at least a portion of a structure on the devices. One benefit of determining the alignment of the devices is that misalignment in the devices on the substrates may be used to correct or reduce subsequent misalignment of devices on a subsequent substrate that is being formed.

In one embodiment, the misalignment of one or more of the plurality of devices may be determined based on the alignment. The misalignment of a plurality of devices of a subsequent substrate that incorporates the devices may be corrected to reduce the misalignment amongst the plurality of devices.

Alignments of the devices of the second group or plurality of devices on the second substrate are determined and the devices are grouped into one or more groups based on the respective alignment for each device of the second plurality of devices, i.e., devices having similar alignments are grouped together. Fields of view of an exposure system such as a stepper are established based on the groupings of the devices and a motion path for exposing the second plurality of devices is determined. The path is generally based on the one or more groups and the fields of view. The path is scored and is assessed to ensure that the score satisfies a threshold. If the path does not meet the threshold value, the grouping of the second group of devices, the determining of the fields of view, the determining of the path, and the determining of the score are iteratively repeated to form successive groupings, fields of view and paths until the assessed score passes the threshold. Once this criteria is met, the second plurality of devices is exposed using the fields of view and path that satisfied the threshold.

A method, computer program product, and product manufactured by the method for correcting overlay errors are provided. An alignment for each device of a group of devices mounted on a substrate is determined. An alignment error for the group of devices mounted on the substrate is determined based on the respective alignment for each device. One or more correction factors are calculated based on the alignment error. The one or more correction factors are sent to a lithographic system for correcting the alignment error.

A method, computer program product, and product manufactured by the method for determining an optimized exposure path are provided. An alignment for each device of a plurality of devices mounted on a substrate is determined. The plurality of devices is grouped into one or more groups based on the respective alignment for each device. Fields of view or shots for exposing devices in each of the one or more groups are determined. A stepper path for exposing the plurality of devices is determined based on the one or more groups and the fields of view. A score for the determined stepper path is determined and then examined as to whether the score satisfies a threshold. In response to determining that the score does not satisfy the threshold, the steps of grouping of the plurality of devices, the determining the fields of view, and/or the determining the stepper path, are iteratively repeated until such time that the threshold is satisfied. Scores are computed for each iteration of these operations.

A method, computer program product, and product manufactured by the method for conducting a lithography exposure process are provided. An alignment of a plurality of devices in a reconstituted substrate is determined. The plurality of devices is organized into one or more groups by their alignment, each set corresponding to a field of view addressable by an exposure system. A sequence and a path to address each corresponding field of view to its respective set of devices at an alignment that matches the alignment of substantially all of the devices in the set to within a predetermined overlay error tolerance is defined. Each of the sets of devices is exposed using the defined sequence and path to modify the devices.

These and other advantages will be apparent to those of ordinary skill in the art by reference to the following detailed description and the accompanying drawings.

BRIEF DESCRIPTION OF THE DRAWINGS

FIGS. 2A-2F show exemplary semiconductor devices having different degrees of alignment.

DETAILED DESCRIPTION

There are a number of different correction factors that are used in lithographic processing. These different correction factors are used to align the die or devices in the substrate with the exposure of the lithographic machine. If the alignment is not precise then the die in the substrate will have defects and will either not work or will not work as intended. This is considered unacceptable by semiconductor manufacturers and these defective devices cannot be sold, resulting in financial loss for the semiconductor manufacturers. The correction factors that are used to align the die with the exposure include a magnification correction factor called mag, a rotation factor called $\Theta$ (theta), and translational movements called x and y. There are also other correction factors such as scale correction and trap. These correction factors can be used together when trying to align the exposure to the die or device. The issue is that currently some correction factors such as mag were limited after being globally set before starting the exposure process and some factors had a limited range, such as the stage $\Theta$ correction limit. This meant that there were limits to the exposure alignment to the devices in the substrate. Furthermore, some of the correction factors impacted the speed of the lithographic machine by having to reset and calibrate what the lithographic machine was doing. This meant there were limitations to the corrections that could be made while a lithographic machine was processing a wafer or panel. The limitations have been overcome with a unique and interesting technique to extend what can be done with the correction factors. These extended corrections can be made by manipulating the reticle position in six degrees of motion on the lithographic machine.

Figure 1A:
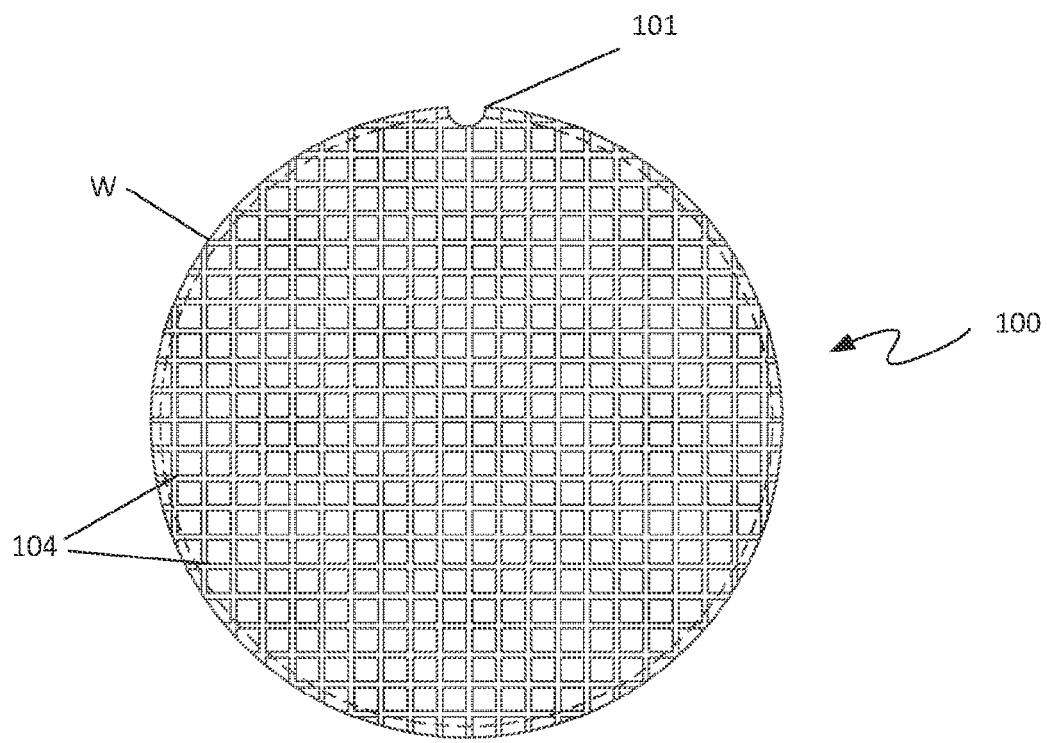
FIG. 1A shows an exemplary semiconductor wafer.

Lithographic processing to create semiconductor or other electronic devices is carried out on many different types of substrates 100. One of the most common is a semiconductor wafer W such as that shown in FIG. 1a. Wafer W is generally a flat discoid object of varying diameter. The wafer W generally includes an orientation structure 101 such as the illustrated notch. Marks, flats and other structures may be substituted for a notch. Wafers W are generally formed of a semiconductor material such as silicon, gallium arsenide, and the like, though in some instances glass or composite materials such as epoxy are used. These wafers W are commonly found in 200 mm or 300 mm diameters, but larger and smaller wafers W are common.

Figure 1B:
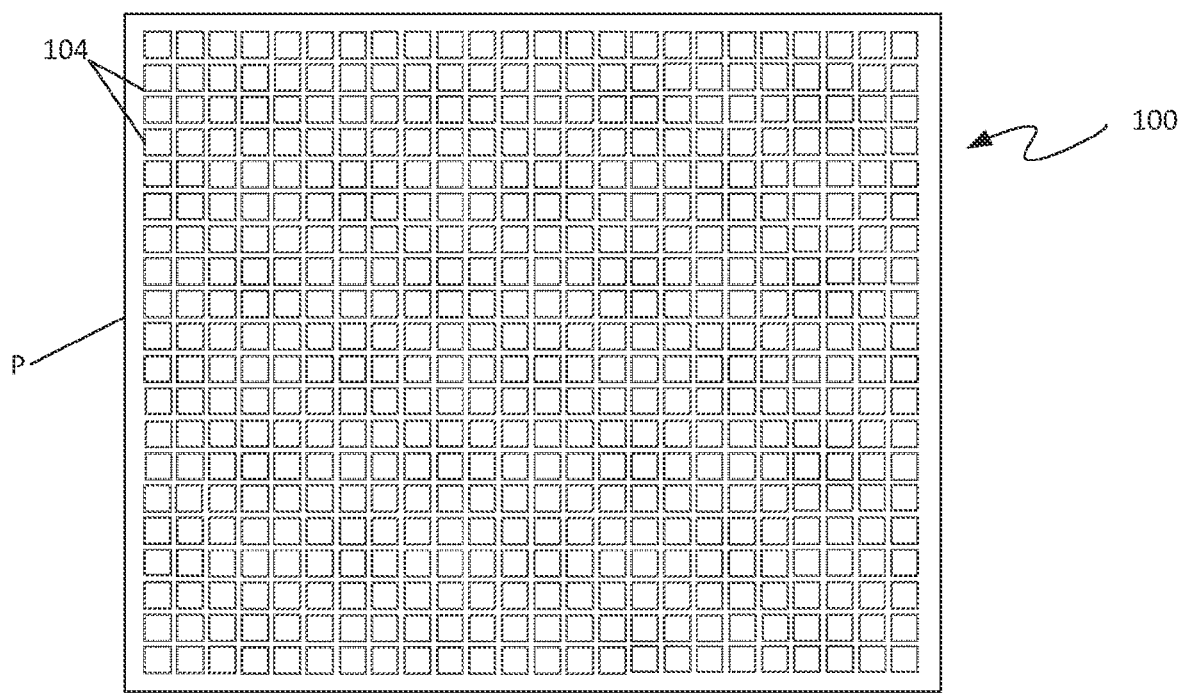
FIG. 1B shows an exemplary semiconductor panel.

FIG. 1b illustrates a generic panel P of a type commonly addressed using lithographic processes. As with wafers W, panels P may be formed of semiconductor materials or of glass or composite materials. Panels P are generally rectangular or square in shape. Panels P may be of any useful size, but are often encountered in "generation" sizes defined in the table below.

| Generation | Size (mm) |
| --- | --- |
| Gen. 1 | 300 × 400 |
| Gen. 2 | 360 × 465 |
| Gen. 2.5 | 400 × 500 |
| Gen. 3 | 550 × 650 |
| Gen. 3.5 | 620 × 750 |

-continued

| Generation | Size (mm) |
| --- | --- |
| Gen. 4 | 730 × 920 |
| Gen. 5 | 1100 × 1300 |
| Gen. 6 | 1500 × 1850 |
| Gen. 7 | 1870 × 2200 |
| Gen. 7.5 | 1950 × 2200 |
| Gen. 8 | 2200 × 2500 |

As used herein, the term "substrate" will refer to wafers and panels collectively. Where some specific information specific to either a wafer or a panel, respectively, is to be related, these specific terms will be used.

At various stages of manufacture, a substrate 100 may be bare, not having circuitry formed thereon as yet, or may include devices 104, e.g., integrated circuit devices. Some substrates 100 may have devices 104 formed in their entirety on the same substrate. Other substrates 100 may include multiple devices 104 that are taken from discrete and separate substrates 100 and then connected together using adhesives, molding or potting materials to form a composite or reconstituted substrate 100. As a general rule, reconstituted substrates 100 tend to have much poorer alignment than those substrates 100 on which devices 104 were natively formed.

Figure 2F:
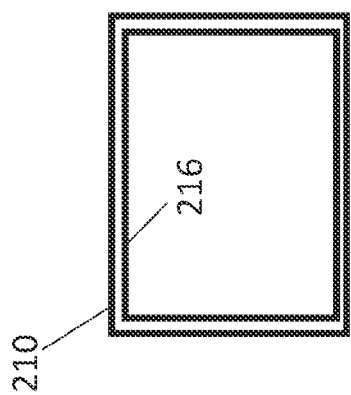

FIGS. 2a-2f illustrate what is meant by misalignment in a device 104. Device 104 in FIG. 2a is representative of a redistribution layer (RDL) that often forms part of a semiconductor device package. Device 104 includes bumps 105 that are connected to traces 106. In FIG. 2a, the respective bumps 105 and traces 106 are in electrical contact with one another. The bumps 105 and traces 106 are formed separately from one another, but because the lithographic patterns used to form these structures are properly aligned to one another on the device 104, the bumps 105 and traces 106 are well formed and of acceptable quality.

FIG. 2b illustrates a scenario in which the bumps 105 of the device 104 are formed by a lithographic pattern that is offset from that of the traces 106 by an amount OX and OY in the X and Y directions. Note that many of the traces 106 do not make electrical contact with the bumps 105. FIG. 2c illustrates a scenario in which the lithographic pattern used to form the bumps 105 is rotated with respect to the lithographic pattern used to form the traces 106 by an angle Θ. Again, there is poor connection between the bumps 105 and the traces 106. For purposes of this disclosure, alignment will be discussed only with respect to translations and rotations in the XY plane of the devices 104 and the substrates 100. Other, higher order, aberrations such as scale, tip, tilt, overlay errors out of the XY plane, and the like may also be accommodated using the methods and apparatuses of the present invention, but such accommodations are omitted for the sake of clarity. Aberrations of the type mentioned above are more fully described in J. D. Armitage Jr., J. P. Kirk, "Analysis Of Overlay Distortion Patterns," Proc. SPIE 921, (1988).

Figure 2E:
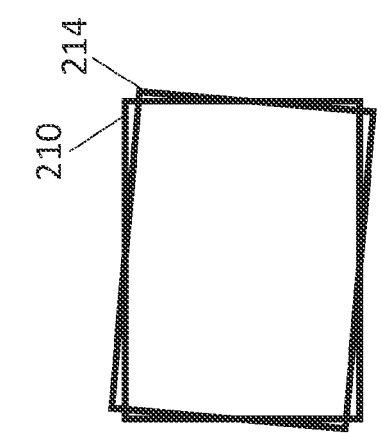
Figure 2D:
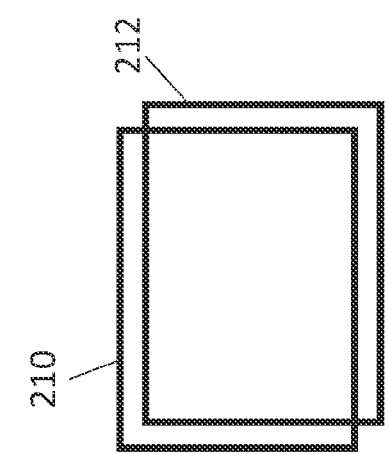

FIG. 2d illustrates a situation where an overlay correction needs to be made because there is a translation in the X and Y directions. This can occur when a die or device has an error associated with its position relative to other die or devices. Here the device 210 is not where it is expected for the second layer 212 based on substrate alignment indicators. These errors can arise, for example, from the curing process of a reconstituted wafer or from the pick and place machine. FIG. 2e illustrates a situation where an overlay correction needs to be made because there is a rotation theta in the device or die. Here the device 210 is not where it is expected for the second layer 214 based on substrate alignment indicators. Again, this error can be introduced, for example, from the curing process of a reconstituted wafer or from the pick and place machine.

FIG. 2f illustrates a situation where an overlay correction needs to be made because there is a magnification effort in the device or die. Here the device 210 is larger than the expected size of the second layer 216. In advanced packaging applications, various processing techniques can be used including some high temperature treatments. If the first layer devices or die were manufactured at a different temperature than the next layer exposure the size of these devices or die on the substrate may expand or shrink depending on the temperature at the time of the next layer exposure. These changes in size introduce mag error. Without mag compensation, the second layer exposure will not match the correct size of the first layer die or device and this will cause an overlay error that can result in device failure.

Figure 3:
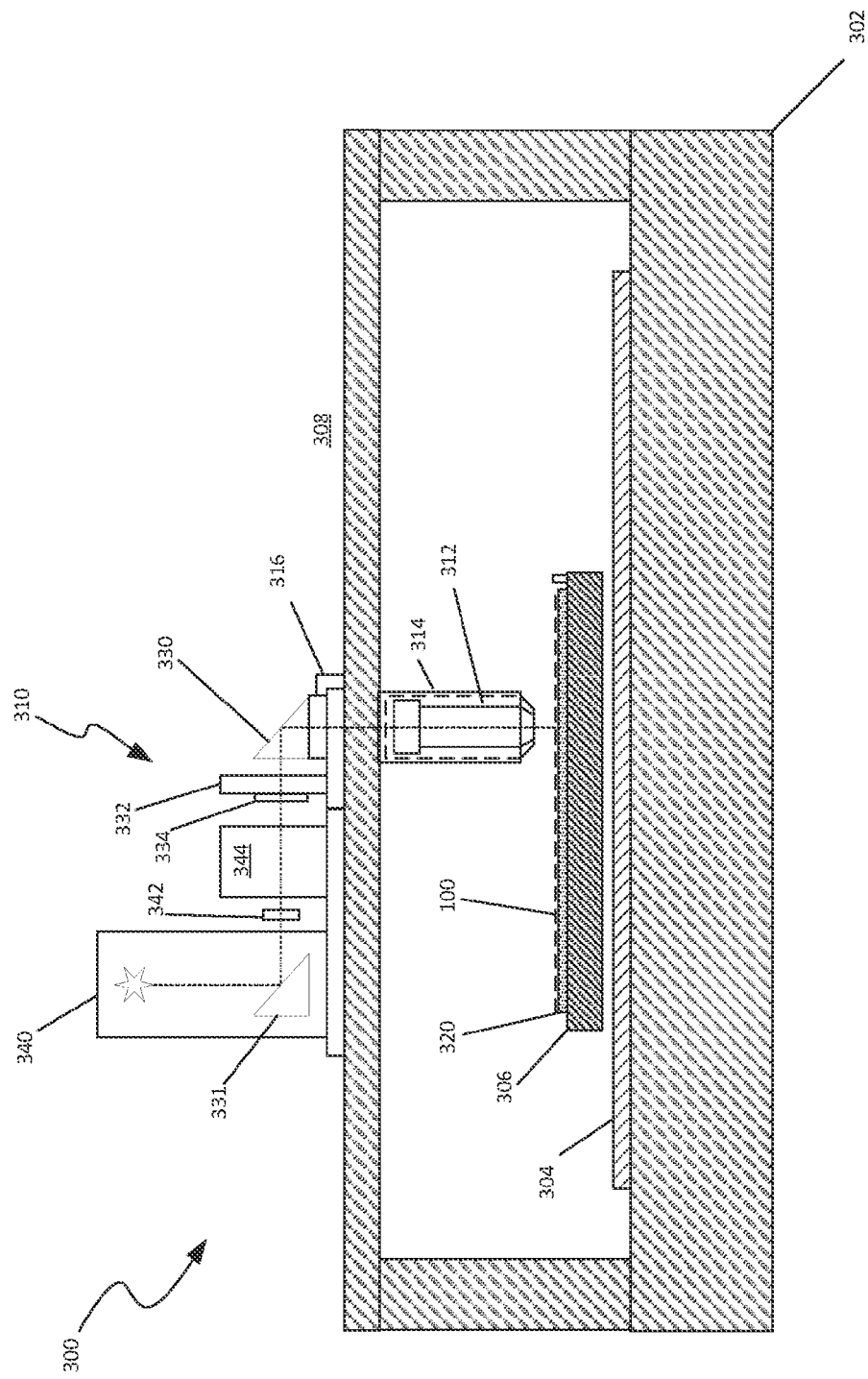
FIG. 3 shows a lithography system known as a stepper.

FIG. 3 is a diagram of a lithography system 300 that may benefit from the application of the present invention. The lithography system 300 includes a base 302, which is typically a large block of finished granite that sits on isolation supports (not shown). The combination of the large mass of the base 302 and the design of the isolation supports provides isolation of the lithography system 300 from floor vibrations. The isolation supports also prevent machine forces from getting into the factory floor and disturbing nearby machinery. The base 302 and isolation supports may be constructed from common commercial parts and materials.

On top of the base 302 is a large grid motor platen 304, such as one disclosed in U.S. Pat. No. 5,828,142, hereby incorporated by reference. The large grid motor platen 304 may include a matrix of soft iron teeth of about 1 mm square, separated in X and Y directions by a gap of about 1 mm. The gaps between all teeth are filled with non-magnetic material, usually epoxy. This surface is ground very flat, to tolerances of a few microns, to provide an air bearing quality surface. Flatness is also useful to control tip and tilt of a main X, Y, Θ stage 306 (hereafter referred to as the main stage 306), a possible source of Abbe offset errors in a stage interferometer system.

The area covered by the grid motor platen 304 is large enough to allow the main stage 306 to move to all required positions. The travel area allows movement to a substrate exchange position (at the system front) and throughout an exposure area. The travel area for the embodiment described herein correlates to the size of a substrate carried on the stage 306.

The stage 306 has within its body a number of forcer motors (not shown). These motors are arranged to drive the stage across the grid motor platen 304. Two motors are oriented to drive the main stage 306 in an X-axis direction. Two additional motors are oriented at 90° to drive the main stage 306 in a Y-axis direction. Either or both pairs of motors may be driven differentially to provide small rotation motion (Θ). In this manner, the main stage 306 may be controlled to move in a very straight line even though the tooth pattern in the grid motor platen 304 may not be straight.

In FIG. 3 the stage 306 is shown as having a chuck 320 mounted thereon. The illustrated chuck 320 has a form factor adapted to support a substrate 100 that is a panel P. As described in U.S. Pat. No. 7,385,671, the chuck 320 may have substituted therefore different numbers or types of chucks or top plates adapted to hold different substrates 100 such as silicon wafers W. U.S. Pat. No. 7,385,671 is hereby incorporated by reference.

A stiff bridge structure 308 supports a projection camera 310 above the main stage 306. The projection camera 310 has a projection lens 312, of approximately 2× (i.e., two times) reduction, mounted in a lens housing 314. The lens housing 314 is mounted on two Z-axis (vertical) air bearings, not shown. These air bearings may be commercially purchased and are preferably a box journal style, which are very stiff. This Z-axis motion is used to move the lens housing 314 and projection lens 312 up and down over small distances needed for focus. The projection lens 312 is preferably telecentric at its image side, so that small changes in focus do not cause image size or image placement errors. Note that other optical arrangements and magnifications are contemplated and the optical arranged described herein is not to be taken as limiting.

The projection lens housing 314 has an individual, real-time, auto-focus sensor (not shown) attached to its bottom. These sensors use simple optics to transform a laser diode light source into a focused slit of light at a substrate 100. Some of the light from this slit reflects off the substrate 100 and is captured by a receiving side of the real-time auto-focus sensor. The reflected slit light is imaged by the receiving optics onto a linear CCD array (not shown). Image processing software is used to locate the image of the reflected slit on the CCD array. Any shift in the position of the image of the reflected slit is then used to control Z-axis drive 316 for projection camera 310, until the position of the image on the CCD array is restored. In this manner, the "focus" of projection camera 310 is maintained at a constant gap. During the construction of a lithography system, the motion of the Z-axis in micrometers is used to determine the motion of the image on the CCD array in pixel units. This calibration permits conversion of subsequent focus offsets to be implemented as pixel offsets in the Z-axis focus control system.

Attached to the top of the lens housing 314 is a fold mirror 330. This mirror 330 puts the remainder of the projection camera 310 off to the left side in the Figure. In this embodiment, the projection lens 312 is designed to have a long working distance at its object side to permit use of the fold mirror 330. Note that by the omission of fold mirrors from the projection camera 310, a straight optical path may be achieved. Fold mirrors having different orientations may also be used to further form the optical path of the projection camera 310 to meet whatever space requirements that exist.

Projection camera 310 has its own 6-axis reticle chuck 332, which holds a reticle 334 that includes the (lithographic) pattern or mask being imaged onto the respective devices 104 of the substrate 100. The reticle 332 chuck can be moved using a voice coil. The reticle 334 may be referred to as an image source. It should be understood that other devices may also be used as image sources, such as a multi-mirror light valve or an LCD light valve that dynamically generates a mask (i.e., a maskless image source). The reticle chuck 332 being a 6-axis reticle chuck means it has 6 degrees of freedom for motion.

The stage 306 is used to make adjustments during the lithographic exposure process. However, as mentioned earlier, the stage 306 is limited in the amount of Θ correction that it can apply between exposures, and the stage 306 alone cannot make mag corrections.

A technique in accordance with the present disclosure moves both the reticle chuck 332 and the stage 306 to increase the amount of correction that can be applied between exposures or at a particular frequency. The reticle chuck 332 and the stage 306 adjustments can be made per site (also known as an exposure field), per zone (also known as a region), or per package. The reticle chuck 332 can be moved to adjust Θ (rotation), mag (magnification), and trap, while the stage 306 can be moved to adjust X, Y and Θ. The reticle chuck 332 and the stage 306 can be moved at approximately the same time or the movements of the reticle chuck 332 and the stage 306 can overlap. The reticle chuck 332 and the stage can be moved between exposures independently of one another. Together, the movements of the reticle chuck 332 and the stage 306 provide a much greater range of correction that can be applied while processing a substrate compared to moving only the stage 306.

The optics of the current system support +/−400 ppm only over the entire panel or wafer. This new feature allows the lithographic system to achieve +/−400 ppm per exposure site, thus allowing for corrections that are very specific to the local deformations and for mag corrections to be made between exposures. By combining the correction capability of both the stage 306 and the reticle chuck 332, the Θ correction extends the range from +/−650 µRads to +/−2.25 mRads between exposures on a per site or per zone basis. This provides an increase of nearly 3.5× in angular correction capability. Depending on the embodiment, the projection lens can be moved up or down (vertically) to correct mag error or the reticule chuck can be moved up or down (vertically) to correct mag error.

In an embodiment, the corrections are be based on desired specifications such as a recipe designed by a user. The movements of the reticle chuck 332 and the stage 306 can be controlled by software. The software receives measurement data regarding dies or devices in the substrate, and uses the measurement data to determine necessary adjustments to the reticle chuck 332, which moves reticle 334, and the stage 306. The software may to configured to perform calculations that determine how to adjust the stage 306 based on movements of the reticle 334. The software can make the adjustments to the reticle chuck 332 and the stage 306 based on a user specified recipe. In some embodiments, the software is configured to adjust the mag by activating and moving the projection lens 312 using a piezoelectric, voice coil, or other suitable motor or technique.

Illumination for the lithography exposure is provided by a lamp house 340 that encloses a mercury lamp that in one embodiment outputs about 3500 watts power. The light source within the lamp house 340 is collected, focused, and filtered, and then exits the lamp house 340 near a shutter 342. Note that as shown, the lamp house 340 includes a fold mirror 331 that allows the optical path of the projection camera 310 to be made more compact. The folded arrangement of the projection camera 310 illustrated in FIG. 3 is only one configuration of many that can be or are commonly used.

When the shutter 342 is opened, light source from the lamp house 340 passes through a condenser lens assembly 344, through the reticle 334, through projection lens 312, and exposes the substrate 100 with the image imposed by the reticle 334. As is well understood, the substrate 100 is coated with a photo-sensitive resistive coating. A dose sensor (not shown) may be part of the shutter 342. Where the pattern projected by camera 310 is well aligned with the devices 104, one obtains a good quality product such as that shown in FIG. 2a.

The foregoing description is of a stepper type configuration for a lithography system. Other configurations such as scanners and imprint lithography systems are well known and may benefit from the application of the present invention.

Figure 4:
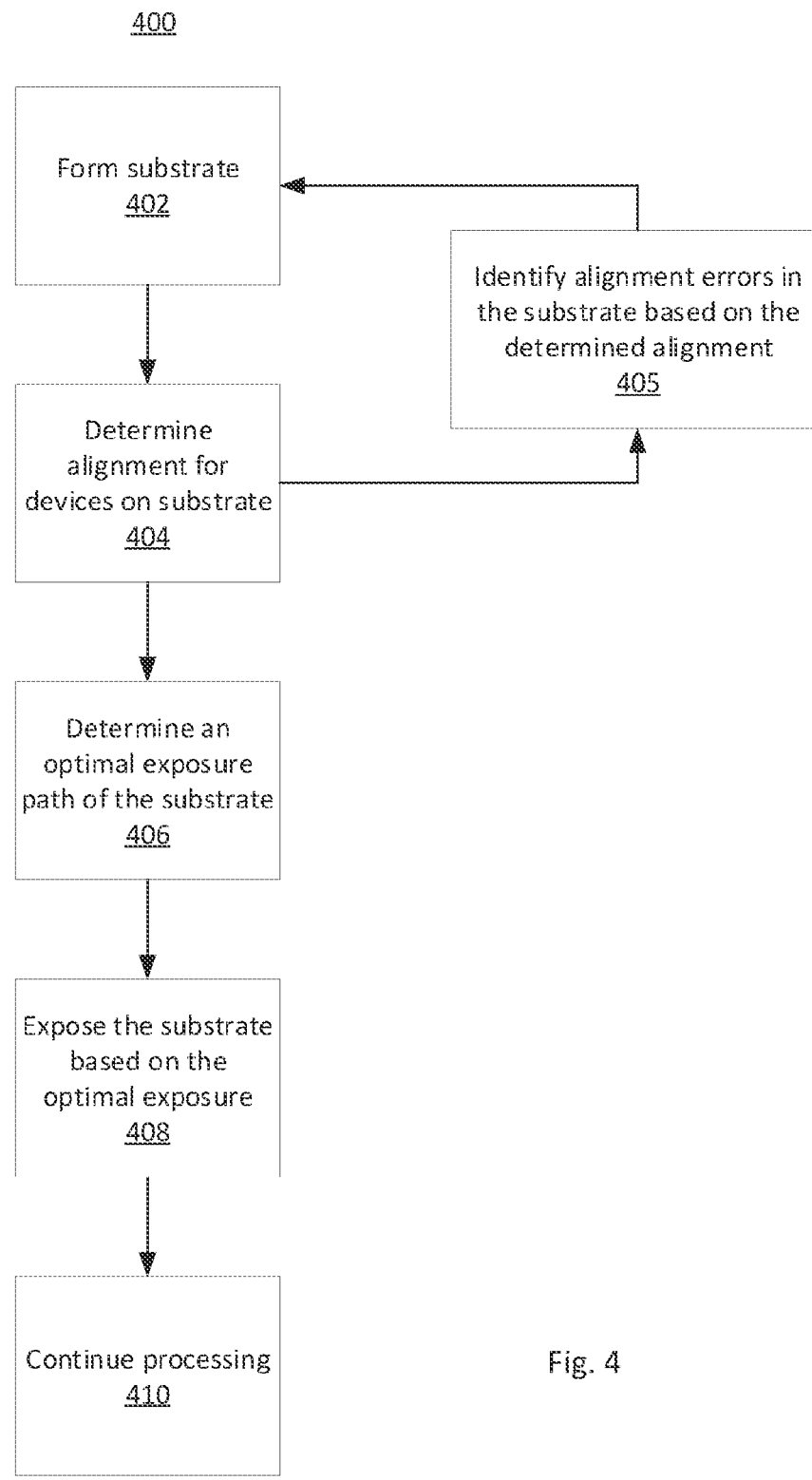
FIG. 4 shows an exemplary method of optimizing lithographic exposure of a substrate.

FIG. 4 shows a method 400 for optimizing exposure of a substrate 100 during lithography in accordance with one or more embodiments. Method 400 may also be applied to correct and/or account for the misalignments on the wafer during the semiconductor manufacturing process.

At step 402, a substrate 100 (either a wafer W or panel P) is formed. The substrate 100 may include devices 104 or other circuitry or structures commonly formed using lithographic processes. The substrate 100 may be formed with the devices 104 in situ or may be a reconstituted substrate 100 in which multiple devices 104 are individually placed in an array using a pick and place or similar system and then molded or potted to form a reconstituted substrate 100.

At step 404, an alignment is determined for devices 104 on the substrate 100. The alignment may be determined using an inspection system. Any suitable inspection system may be used. One example of a suitable inspection system is the Firefly® semiconductor inspection system from Onto Innovation Inc. of Wilmington, Mass. An inspection system facilitates the identification of misalignment and the computation of proper alignment for each device or group of devices on the substrate 100. The inspection system can be part of the lithography system in some embodiments.

Method 500 will be described in more detail below. At step 405, alignment errors (and other defects) of devices 104 of the substrate 100 are used to determine correction factors that may be applied to the lithography system to remediate subsequent overlay errors derived from the inspection or lithography systems. The correction factors are, from a practical point of view, used to generate offsets that modify the operation of the lithography system and specifically the reticle chuck 332 and stage 306. The correction factors may include specific distances or angles that are added or subtracted to the reticle chuck 332 and/or stage 306. For example, a stage 306 may be instructed to move to a nominal X, Y location that is in reality incorrect due to errors detected during the alignment step 404. Offsets generated from the correction factors that are an output of step 500 modify the nominal X, Y position. The correction factors may also be a set of distances or angles that are applied to an alignment of a substrate 100 where the alignment may be corrected by applying correction factors to offset the X, Y, mag, and Θ alignment of the substrate, thereby reducing or eliminating systematic error. These correction factors may be fixed, as where the systematic error is consistent over time, or may be transient based on one or more environmental characteristics, such as temperature or pressure. Additive or cumulative errors may also be corrected in this manner. Alignment errors may be identified based on the alignment identified at step 500.

Alignment errors are identified relative to the substrate 100 of which the devices 104 are a part and/or relative to other devices 104, i.e., in some instances the alignment of devices 104 are determined relative to the substrate 100 and in other instances, alignments between selected devices 104 are obtained. Alignment data is captured and recorded in a data file associated with each substrate 100 and/or device 104 for future use and reference. Examples of such data files are comma separated value (CSV) or an extensible markup language (XML) file. Other file types may be used as well. Based on the identified alignment errors, correction factors are calculated and fed back to the mechanisms and processes used to carry out step 402. Step 405 will be discussed in further detail below with respect to FIG. 5.

At step 406 an optimal recipe that includes an exposure path of the substrate 100 is determined. The alignment of each device 104 (determined at step 404) is used to find an optimal exposure recipe that will maximize value. In one embodiment, the inputs to this optimization include the determined alignment as well as throughput and yield goals, though ultimately, the goal of the optimization process is to maximize value. As those skilled in the art are aware, alignment can be correlated directly with yield. Where the layers of a semiconductor device align well with one another, the likelihood that the device will function as designed is high. This correlation is sometimes used as shorthand to specify the tolerance for alignment, that is, by specifying a high yield output for a lithography process, one is requiring a very high accuracy for alignment. As alignment of a mask/reticle to a device 104 has a time cost associated with it, tighter alignment requirements will slow the processing of substrates 100. At one end of the spectrum, perfect yield reduces throughput because too many alignments or inefficient paths takes up process time. At the other end of the spectrum, yield suffers where too few or too coarse alignments are used.

One benefit to the present invention is that the same alignment information obtained at step 404 may be used to generate alignments for lithography exposure and for the generation of correction factors that can be used to remove systematic error in the placement of devices 104 in substrate 100. This eliminates the need for multiple inspection and alignment processes and saves time, thereby increasing the throughput of the manufacturing process.

An optimal exposure recipe will group devices by alignment and will break these groups up into chunks that are readily addressed by an existing set of available shot sizes and shapes. Available shot sizes and shapes are defined by the masks or patterns found on a reticle 334 in reticle chuck 332, by the masks or patterns on additional reticles 334 that may be substituted for a reticle in the chuck 332 and by the use of masking devices that can modify the patterns on a reticle on the fly. The number and order of the shots and the travel paths between the shots are selected to minimize reductions in throughput. In some cases, it may be better to use well-known boustrophedon paths and change the shot size and shape. In other cases, it may be better to use a complex path in which multiple shots of the same size and shape are exposed before shifting to another size and shape shot. Over time, alignment errors identified at step 404 and fed back to step 402 will reduce overlay error, which will reduce the complexity of the alignment/exposure process, thereby facilitating the determination of the optimal path at step 406 and increasing value.

Figure 6:
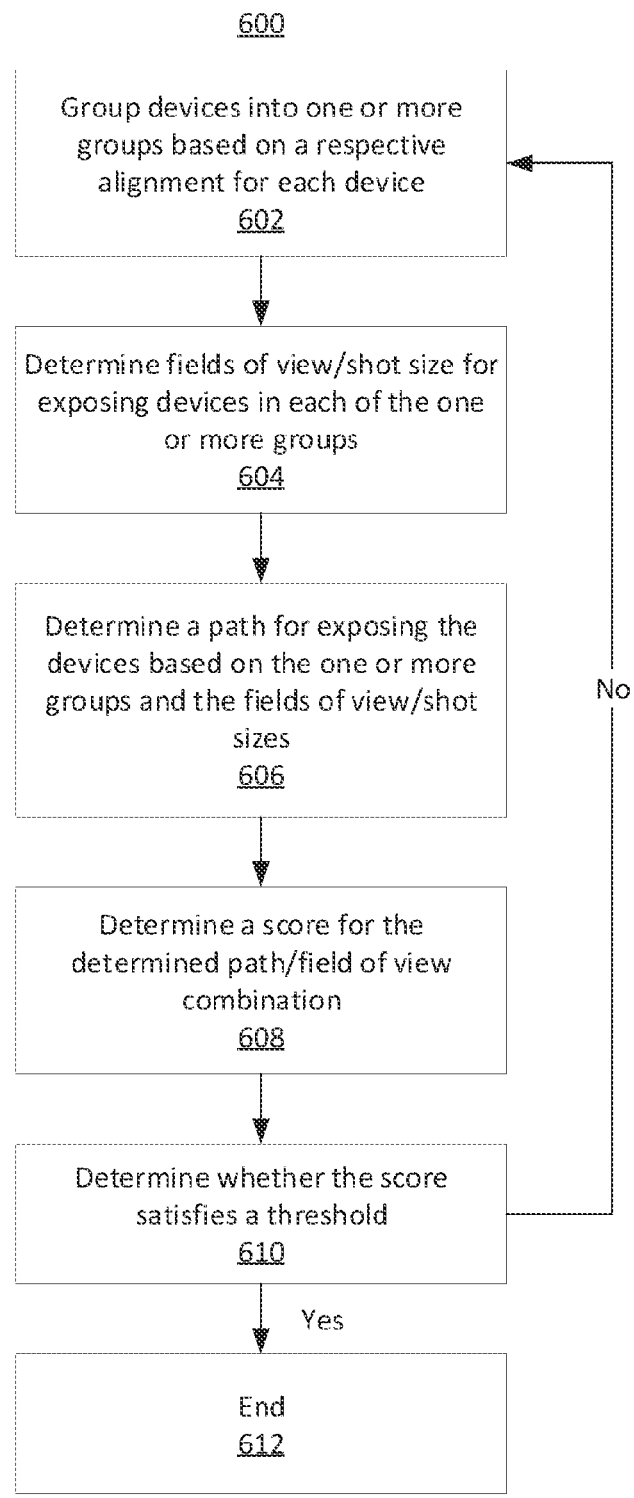
FIG. 6 shows a method for determining an optimal exposure of a wafer.

Step 406 will be discussed in further detail below with respect to FIG. 6.

At step 408, the substrate 100 is exposed based on the determined optimal exposure recipe using a suitable lithography system such as stepper system 300. Processing of substrates 100 continues at step 410 until all substrates have been completed.

Figure 5:
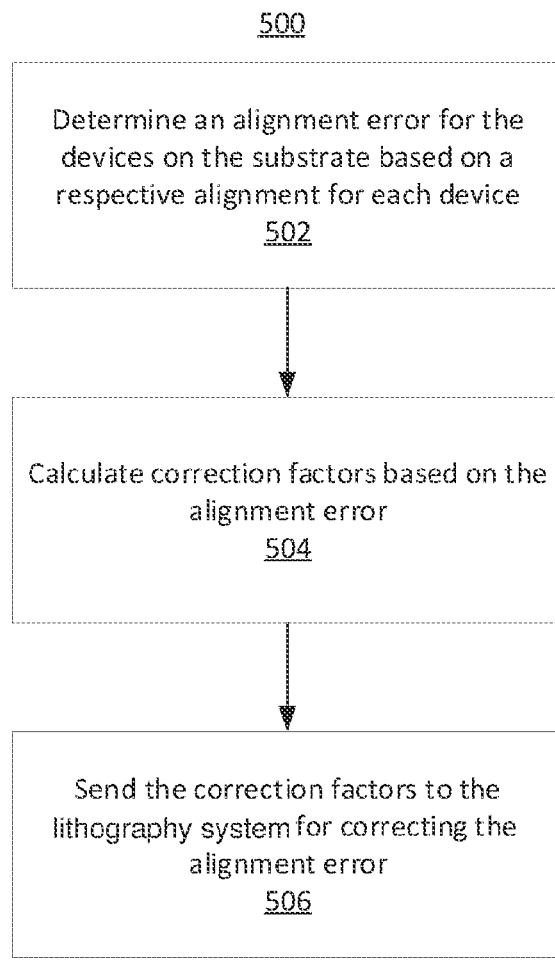
FIG. 5 shows a method for correcting overlay error of devices on a substrate.

FIG. 5 shows a method 500 for correcting overlay error of devices on a substrate 100 such as a reconstituted wafer or panel in accordance with one or more embodiments. Method 500 may be implemented as at step 405 of FIG. 4.

At step 502, respective alignment errors for devices 104 on the substrate 100 are determined based on an alignment of each device. The alignment of each device may be determined using an inspection system at step 404 of FIG. 4. In one embodiment, the measured alignment of each device is compared with a target alignment of the device, and a respective alignment error or offset is then calculated for each device based on the comparison.

Alignment of an entire substrate 100 on a global level is generally determined by capturing images of sufficiently widely spaced fiducial marks formed on the substrate. As described above this may be done using an optical inspection system such as a Firefly® semiconductor inspection system. The location of the fiducial marks is specified in the coordinate system of the chuck or stage to which the substrate 100 is temporarily fixed. Comparison of the XY locations of the fiducials with the nominal or specified positions of these marks is used to generate correction factors such as simple XY offsets for aligning the substrate 100. Angular correction factors (e.g. Θ offsets) can be determined by comparing the angle of a line drawn between the fiducials to a nominal specified axis of alignment. These correction factors are similar to and in some instances may be the same as those described in conjunction with FIGS. 4 and 5. Both the reticle chuck 332 or stage 306 on which the substrate 100 is supported can be moved and/or rotated to achieve the proper alignment relative to a selected coordinate system once the correction factors have been applied to bring the coordinate system of the substrate 100 into alignment with the coordinate system of the lithography system.

As used herein, the term 'alignment' describes both the process of and the data concerning the physical orientation of a device 104 or substrate 100. And because physical orientation is measured relative to something, alignment also suggests the existence of a frame of reference or coordinate system within which the device 104 or substrate 100 can be localized. These frames of reference or coordinate systems may use one or more devices 104, individually or taken together as a group, to establish a coordinate system. Similarly, the substrate 100 itself may define the frame of reference. It is also to be understood that various tools or systems that interact with substrates 100, such as an inspection system or lithography system, may also define a coordinate system. The data files (e.g., CSV, XML, . . . ) mentioned hereinabove capture information about the position of a substrate 100 and its devices 104. This data can then be used to create one or more transforms, i.e., mathematical relationships between the orientation of a substrate 100 and/or its devices 104 and the orientation of a system and/or its components that will act upon the substrate 100. An example of this is the use of a Firefly® inspection system to determine an alignment of devices 104 present on a substrate 100 relative to the coordinate system defined by fiducials present on the substrate 100. A subsequent process step involving a lithography system would then require only that the lithography system determine an alignment of a substrate 100 relative to the coordinate system of the lithography system. The recorded alignment data would then facilitate direct knowledge, by means of a transform, of the alignment of devices 104 relative to the lithography system. Transforms such as those described may be determined in situ by means of alignment mechanisms such as those described herein below. These transforms may also be determined a priori by means of calibration of the respective mechanisms/systems, i.e., the positions of devices 104 relative to a lithography system and its components, such as a reticle, may be determined in advance of actually placing the substrate 100 in the lithography system.

Alignment of individual devices 104 is optically carried out as described above by capturing images of the individual devices 104, identifying fiducials (which often are simply distinctive features in known positions on the device 104), and identifying their XY positions and Θ orientation with respect to a coordinate system of the substrate 100 itself. Alignment of both substrates 100 and the devices 104 that are contained therein may be conducted using images, as described above, but may also be conducted using non-imaging techniques such as laser triangulation, confocal sensing, interferometry, or the like. In such non-imaging techniques, a non-imaging sensor will be able to localize some aspect of a device such as the aforementioned fiducials and or features. As will be appreciated, this alignment step produces alignment information or transforms for each device 104 relative to the substrate 100 of which they are a part. This data is maintained in a database or in file that is retained and which can be queried whenever the substrate 100 is to be acted upon in some way. The upshot is that with this saved alignment data, one can, with a simple alignment of the substrate 100 to the coordinate system of an inspection or processing system such as a lithography stepper 300, immediately have access to alignment data that allows immediate alignment of the system 300 to the devices 104 without measuring their alignment once again on the lithography stepper 300.

The database or data files that retain the aforementioned alignment data are commonly maintained in a readily portable and modifiable such as the XML format. These data files are further capable of maintaining alignment data for multiple layers of the device 104 structures. This multilayer data can be used to assist in the determination of an optimal recipe or approach to processing a substrate 100. For example, while the underlying alignment of a device 104 relative to its substrate may not change over time, it is possible that a process step may form a layer of the device 104 in a misaligned fashion. So long as the misalignment does not itself render the device 104 inoperable, subsequent processing (more layers) may be performed. But because there is a overlay error in the uppermost layer of the device 104, proper alignment to the device is not necessarily the same is it would have been were the previous layer properly aligned. Subsequent process steps would be required to accommodate the overlay error of the previous layer. As will be appreciated, the use of a Firefly® or other inspection or alignment system makes it relatively easy to identify and record misalignments by layer.

One use of the aforementioned data files is the identification of systematic error in the positioning of devices 104 in a substrate 100. While this type of error is most often found in more variable reconstituted substrates, wafers and panels formed from scratch, as it were, may also have systematic error of various types. Systematic alignment errors are alignment errors that are consistently and predictably present in each substrate or device. Such systematic alignment errors may be a result of a placement system (e.g., pick and place system) or the molding process that form a reconstituted substrate. The alignment error is determined based on the respective alignment error for each device relative to the substrate and/or to other devices. In one embodiment, an average alignment of the devices 104 on the substrate 100 is used as a baseline alignment from which alignment errors are measured. In another embodiment, alignment errors are measured from a nominal alignment that is based on a coordinate system defined by the substrate 100 itself. In both cases, the absolute position of the devices 104 relative to the substrate 100 and any fiducial or other alignment marks of the substrate 100 are determined and retained.

At step 504, correction factors are calculated based on determined alignment errors. As indicated above, alignment errors are measured X, Y, mag, trap, and Θ offsets. Systematic and random error is identified and measured as between multiple substrates 100. While it is to be understood that alignment differences or 'errors' can be characterized within a single substrate, the processes of manufacturing devices 104 are subject to error that extends across multiple substrates 100. Identifying and quantifying error in alignment of devices 104 can be as simple as performing a simple mathematical comparison between respective devices 104 and their ideal counterparts. More involved processes can be used to quantify such alignment error and to determine whether such error is systematic or random. Note that the terms 'alignment error' and 'correction factors' are related in that both sets of information are useful in identifying positional deviation of devices 104 and substrates 100 and in ensuring that processing systems 300 can be readily aligned to the variably aligned devices 104. A correction factor may have the additional connotation of being alignment information that is used to correct the operation of a lithography system.

At step 506, the correction factors are sent (or fed back) to the lithography system. The lithography system can thus adjust the reticle chuck 332 and/or the stage 306 before exposing devices 104 on substrate 100 based on the correction factors in such a way that the alignment error is corrected or minimized. The goal of feeding correction factors backwards to a placement is to minimize error in the alignment of devices 104.

Figure 13:
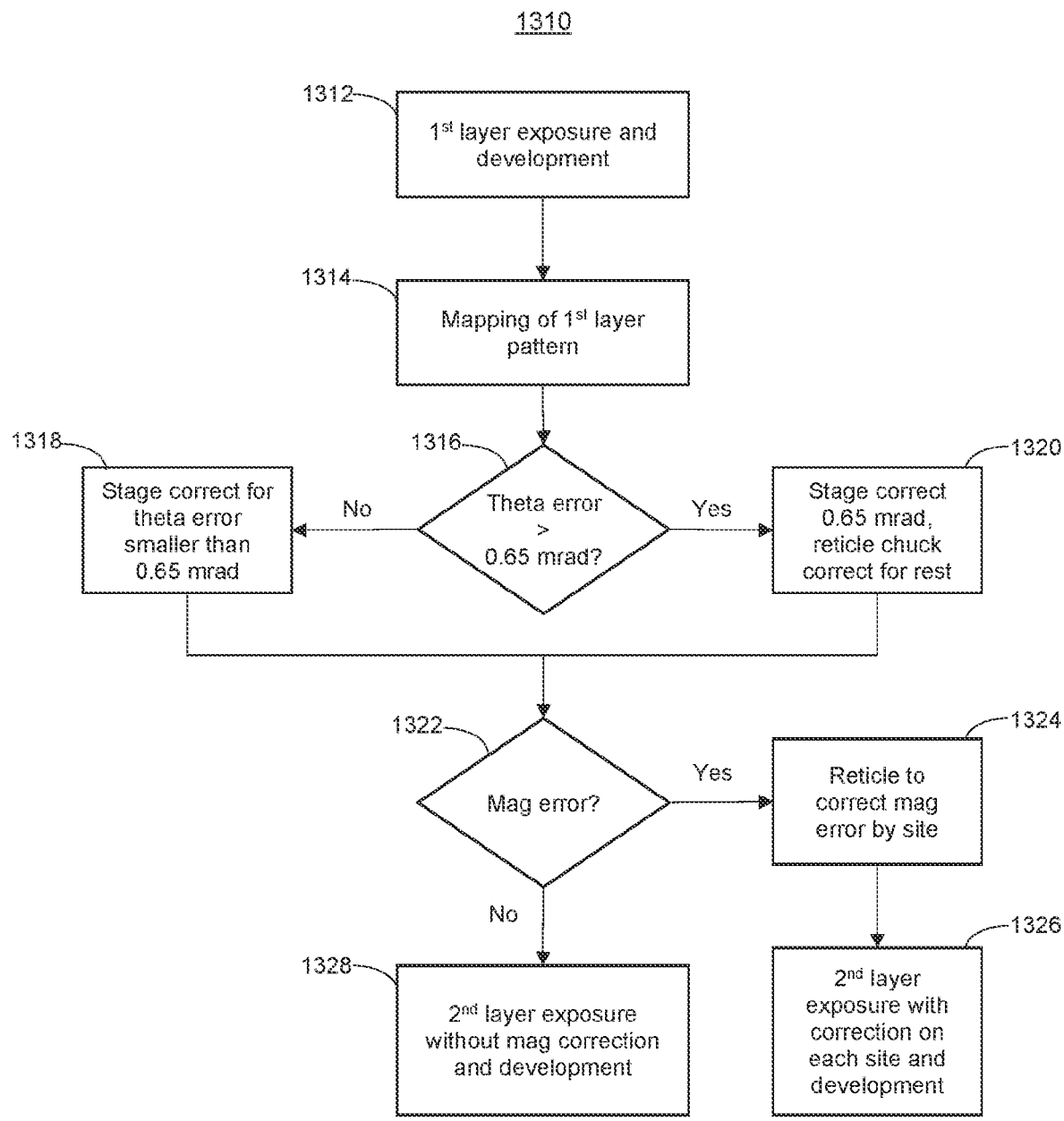
FIG. 13 shows a method for correcting overlay error of devices on a substrate according to an additional embodiment.

FIG. 13 shows a method 1310 for correcting overlay error of devices on a substrate 100 according to an additional embodiment. Mag and theta (Θ) correction functions are can be used to compensate for die or device shifts or previous layer feature patterns.

At step 1312, a first layer pattern is exposed and developed to mimic the previous layer die shift or previous layer feature (e.g., using RDL or vias).

At step 1314, the first layer pattern is mapped. The mapping can be performed by an inspection system that can take a number of measurements to understand the position of an individual die or devices on substrate. When a layer is mapped, then the correction factors can be calculated using a processor and software residing on memory that can be located on the inspection system, a cloud based computing system, or a lithography system. The software takes the measurements from the inspection system and calculates how the next layer will overlay on the die or device in the substrate and calculates the adjustments need to correct the overlay. The mapping results determine the reticle chuck adjustment for the projected image size (mag) and rotation (Θ) and a stage adjustment for X shifts, Y shifts, and rotation (X, Y, Θ). For each exposure site, based on mapping results reticle position is adjusted by the reticle chuck to compensate for mag and theta. Mag, theta, X and Y are determined in the mapping step 1314.

At step 1316, the Θ error is determined, and compared against a threshold. In an embodiment, the threshold is 0.65 mrad. If the Θ error is greater than +/−0.65 mrad, a stage correction is performed at step 1320 to correct the 0.65 mrad, and a reticle chuck correction is performed for the remaining error. If not, only a stage correction is performed for a Θ error smaller than +/−0.65 mrad at step 1318. In an embodiment, the reticle chuck correction alone can correct up to +/−1.00 mrad, while the reticle chuck together with a stage correction can provide up to +/−1.65 mrad theta compensation. The threshold of theta adjustment for stage correction is dependent on the tool and other tools can be have different stage adjustments for theta that can be higher or lower than +/−0.65 mrad. For example, some tools can have a theta stage adjustment of up to +/−1.00 mrad. The stage can also adjust for X and Y corrections during step 1318.

Following steps 1318 or 1320, a magnification error is determined at step 1322. The magnification error is determined based on the mapping results of step 1314, when the mapping results indicate a feature is larger or smaller than what is should be on the first layer.

If a magnification error is present, the reticle chuck is adjusted in the vertical direction to provide a magnification correction at step 1324, e.g., by adjusting a lens to enlarge the projected image for a second layer. The second layer is then exposed with correction on each site, and developed, at step 1326.

If no magnification error is present, the second layer is exposed without mag correction at step 1328.

Figure 14:
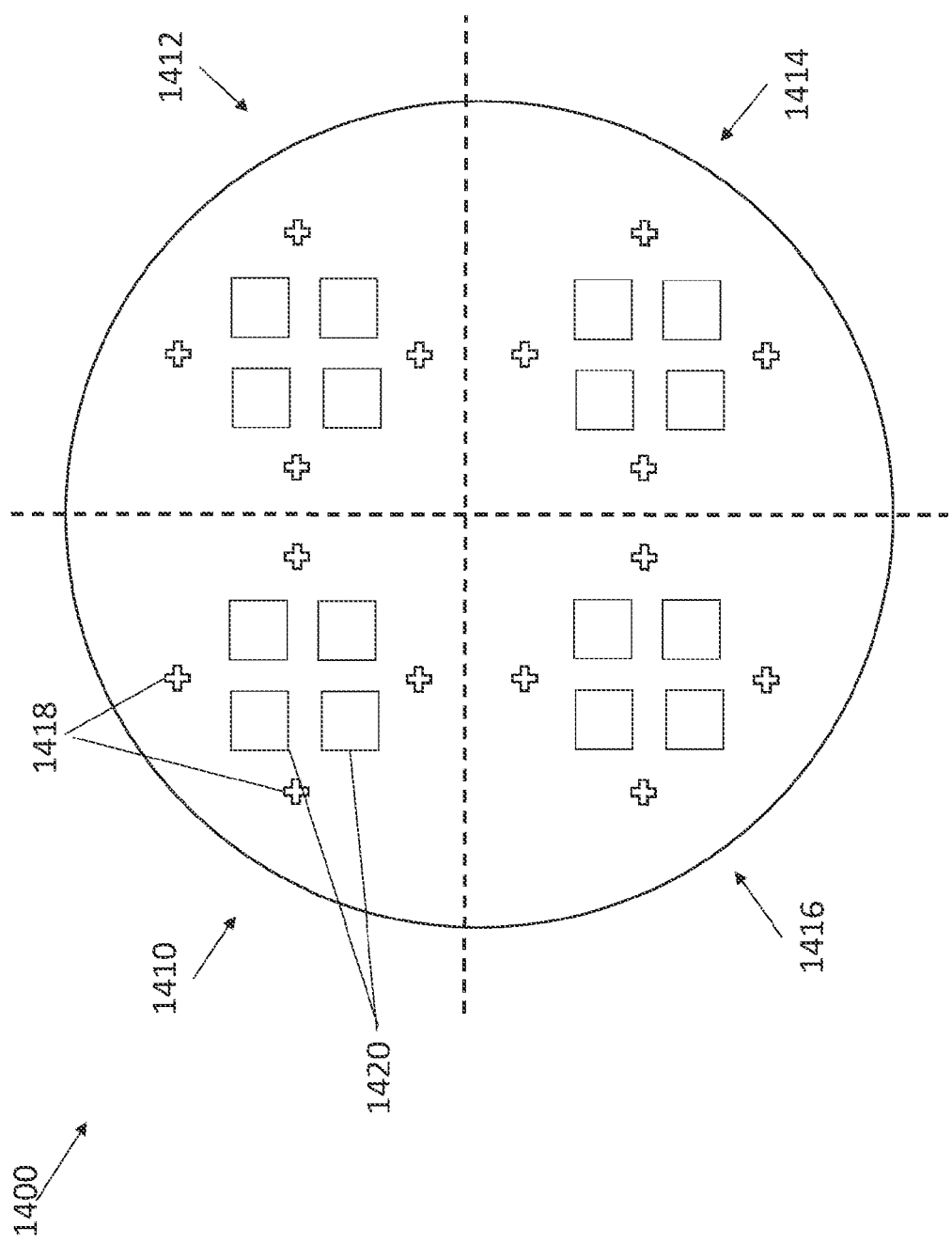
FIG. 14 shows a zone-by-zone correction of an overlay error of devices on a substrate.

FIG. 14 shows zone-by-zone correction of overlay errors. The substrate 1400 here shown as a wafer has four zones: zone 1 1410, zone 2 1412, zone 3 1414, and zone 4 1416. Each zone has a plurality of alignment marks 1418 and a plurality of die or devices 1420. The lithography system uses the alignment marks 1418 to determine the alignment and overlay of the devices 1420 and then adjusts the reticle chuck for the projected image size (mag) and rotation (Θ) and adjusts the stage for X shifts, Y shifts, and rotation (X, Y, Θ) in zone 1 1410. The lithography system then exposes the devices 1420 in zone 1 1410 and moves to the next zone 1412 where the lithography system uses the alignment marks to determine the alignment and overlay of the devices and then adjusts the reticle chuck for the projected image size (mag) and rotation (Θ) and adjusts the stage for X shifts, Y shifts, and rotation (X, Y, Θ) in zone 2 1412. The lithography system then exposes the devices in zone 2 1412. The lithography system repeats this process until all the devices on the substrate 1400 have been exposed. In another embodiment, an inspection system is used to determine the locations of the devices and creates a mapping file that can be used for adjustments to the reticle chuck and the stage for each zone.

Figure 15:
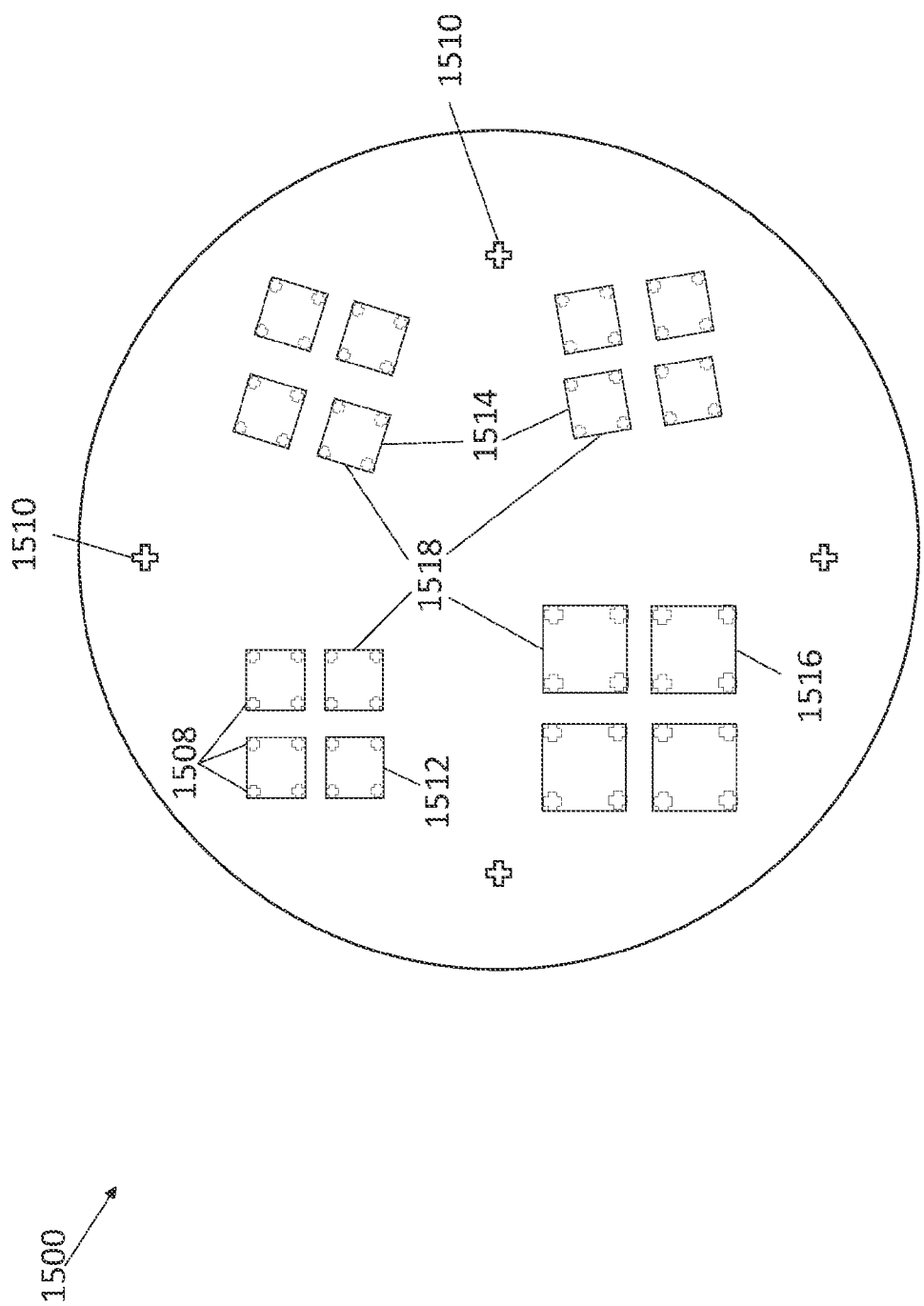
FIG. 15 shows mapping marks and devices of varying alignments on a substrate.

FIG. 15 shows mapping marks and devices of varying alignments on a substrate. Substrate 1500 has a plurality of devices 1518 on the substrate with varying degrees of alignment. The overlay errors include X, Y, and theta offset errors on devices 1514 compared to device 1512. There is also a magnification error (mag) device 1516. Device 1516 has changed size due to process manufacturing techniques that expose device 1516 to different temperatures that can cause expansion or shrinkage of the device. The global alignment marks 1510 are used to align on the substrate and create a reference point for setting up a coordinate plane on the substrate. The mapping marks can then fall within the coordinate plane of the substrate. When additional layers are being added, the global alignment marks can be used to locate the substrate and the mapping software can determine the overlay corrections needed across the substrate. The inspection system determines the mapping marks for the corners of the device and the device's location so that the software can determine a particular device's overlay errors and the adjustments to make on the lithography system by the reticle chuck and the stage. The mapping marks can also be determined by the software after the location information from the inspection system is received.

Before discussing methods whereby a process such as lithography can be optimized, it is important to discuss in a bit more detail the types of criteria or figures of merit that are preferred for optimization. The scoring used to determine an appropriate path and exposure recipe may take any useful form. In one embodiment, a figure of merit is computed based on process criteria and data. This figure of merit may be a cost, in which case it is to be minimized. In other cases the figure of merit may be a profit, in which case it is to be maximized. Other scenarios in which an optimization that falls between the foregoing cases may also be contemplated. In some instances, heuristics may be used in lieu of a more mechanistic figure of merit approach to institute a desirable path and exposure recipe.

One or more criteria may be applied to measure the success or quality of the alignment and, overall, the lithography process. Further, some assessments of alignment and lithography quality may be time shifted, i.e., the assessment may be undertaken after lithography has been completed as a 'look back' at the success of the lithography process as a function of inputs to the system, such as alignment quality, throughput, and the results of optical and electrical testing of the resulting functional semiconductor devices. Criteria such as alignment may be assessed on a one to one basis with a pattern that is to be projected by a reticle or on a many to many basis as where alignment is determined as between a set of devices and the corresponding reticle patterns that are used to expose the devices. The limits, ranges, or thresholds used to establish whether a lithography process is acceptable may be established before the process is undertaken on the basis of a desired outcome. Alternatively, these limits, ranges, or thresholds may be established on the basis of past data that has been analyzed to identify suitable values. By way of example, in some embodiments, acceptable alignment criteria may be established as between 0% and 5% variation from congruence. This range may be high or low depending on the application, and as those skilled in the art will appreciate, by modifying this range, one may modify the yield and throughput of the lithography process.

Determining an optimal recipe for the processing of a substrate 100 is a non-trivial problem. At a very high level, the process involves identifying a suitable arrangement of shots or fields of view to cover the devices 104 on a substrate 100 in a way that meets established alignment and throughput criteria. FIG. 6 illustrates one high level approach 600 to identifying a suitable recipe for lithographic exposure of a substrate 100.

Alignments of devices 104 having previously been determined at step 404, the devices 104 on a substrate 100 are grouped by their respective alignments as indicated at step 602. Next, at step 604, each group of devices 104 has a number of shots mapped or tiled thereover. All or substantially all of the devices 104 are so covered. A path is determined to ensure that each shot of each of the groups is presented to the projection camera 310 for exposure as at step 606. Because it is desirable to ensure that this process proceeds in an efficient manner, scores are determined for the mapping and path finding steps as at step 608. These scores are then assessed at step 610 to determine whether they meet a predetermined threshold value. Steps 602-608 may be repeated where the threshold value is not met or where one desires to minimize or maximize the scores. Advantageously, this process may be performed offline without tying up a lithography system 300.

Turning again to step 602, the process of arranging shots to devices 104 involves grouping devices into one or more similarly aligned groups. In one embodiment, this is done using blob analysis or clustering techniques in which devices 104 near to an initially selected device 104 are assessed to determine whether the alignment of these adjacent devices are within a predetermined range of acceptable alignments. After all adjacent devices 104 are categorized as being part of a group that includes the initially selected device 104, a subsequent, ungrouped device 104 is selected and the analysis is again employed to identify whether adjacent devices 104 are part of a group that includes the subsequently selected device 104. This process continues, ad seriatim, until all devices 104 of a substrate 100 are identified as being part of a group, even if the group in question includes only a single device 104.

In one embodiment, grouping is determined on the basis how far alignment of a device deviates from grid established by the reticle 334 used to lithographically expose devices 104 of a substrate 100. This process is facilitated by having alignment data for each device 104 relative to the substrate 100 stored in a data file as described above. Starting with an initially selected device, the coordinate system of the reticle 334 is aligned with the initially selected device. This alignment and the spacing and orientation of patterns on the reticle establish nominal positions for where adjacent devices should be located. The actual alignments of devices 104 adjacent to the initially selected devices are then compared to the nominal positions to determine if they are within an alignment tolerance. Where an adjacent device 104 is indeed within the alignment tolerance, the adjacent device is considered to be part of a group that includes the initially selected device 104. All devices 104 adjacent to the initially selected device are assessed in this manner. Thereafter, devices adjacent to the newly established group are assessed to determine whether they are within the alignment tolerance. This process continues until no adjacent devices are within the alignment tolerance. Thereafter, a device 104 outside of the newly established group is selected and the grouping process continues. As one would imagine, this process continues until all devices 104 of a substrate 100 are part of a group. Alternatively, the grouping process may be terminated where a group exceeds a predetermined size, usually the size of the largest shot that may be exposed by a lithography system.

Criteria for grouping devices 104 may vary. In another embodiment, a small set of devices 104 is selected and the array of patterns of the reticle is matched thereto to establish a grid. While the number of devices 104 initially selected in this embodiment is arbitrary, at least two devices are required. It is desirable to ensure that the initially selected devices 104 can successfully be exposed together using a common alignment of the reticle to the devices 104, however it is to be understood that in some cases, not all devices 104 can be successfully aligned. That being said, where the initially selected devices 104 cannot be aligned together, it is often preferred to select another set of devices to define a group. As above, devices 104 adjacent to the initially selected set of devices 104 will be assessed to determine whether their alignment will fall within an alignment tolerance with respect to the grid established by the reticle. Adjacent devices are added to the newly established group until devices that satisfy the alignment tolerance can no longer be found. Thereafter a subsequent set of devices 104 are selected to define a subsequent group. One benefit to selecting a set of devices to define a group is that this may avoid the problem of defining groups on the basis of highly variable alignments in some devices 104. The use of multiple devices 104 to establish a group smooths over high variability in alignment.

Figure 7:
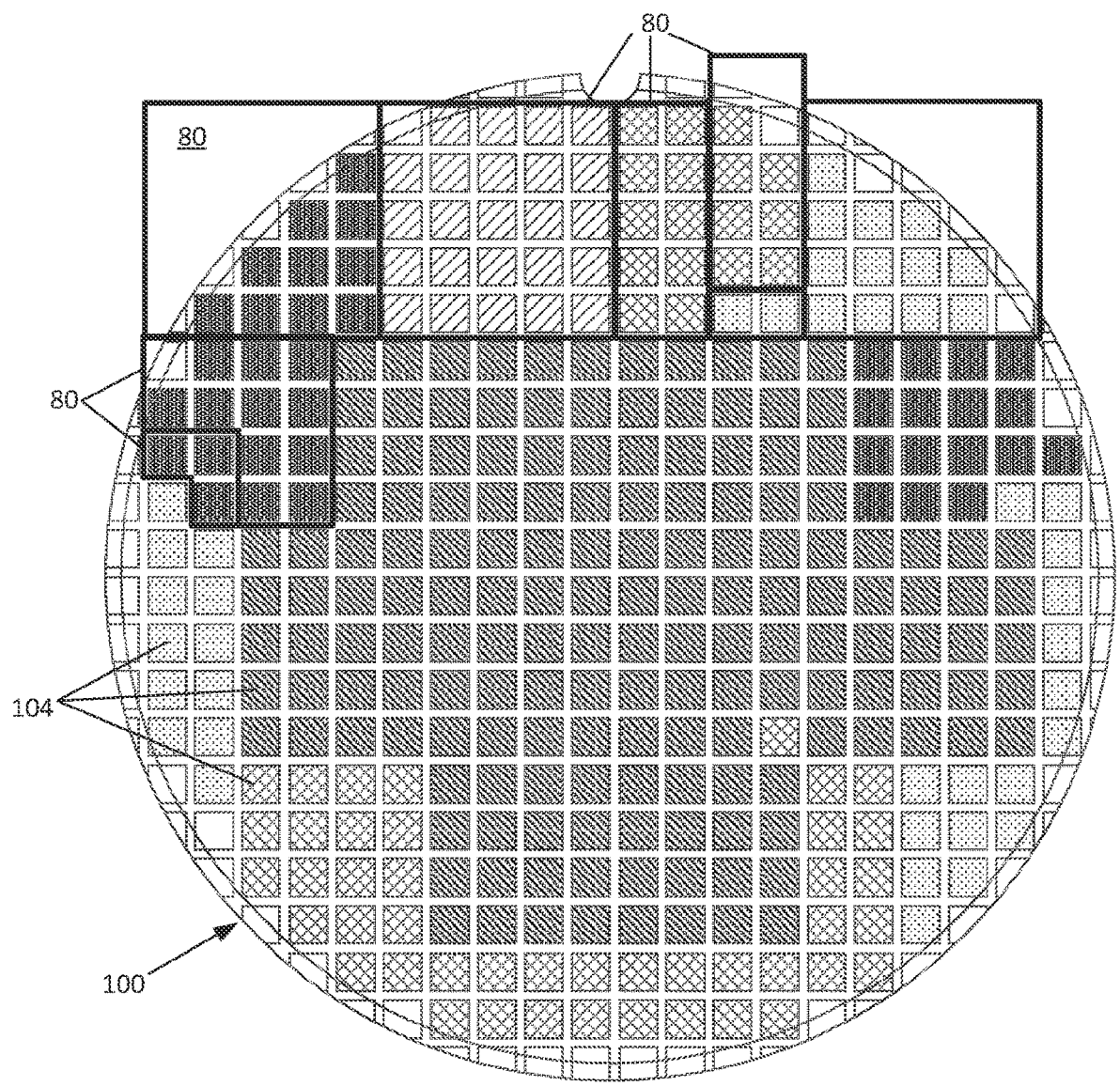
FIG. 7 shows a partial semiconductor substrate exposure tiling.

A simplified representation of what a reconstituted wafer W having devices 104 at different alignments is shown in FIG. 7. The different alignments of devices 104 are denoted by the varying fill patterns of the groups of the devices 104. Note that the groups shown in FIG. 7 are exemplary only and may be much more complex as in the case of poorly aligned reconstituted substrates S with smaller devices 104 or much less complex as where the substrate 100 is formed ab initio with devices 104.

Figure 8:
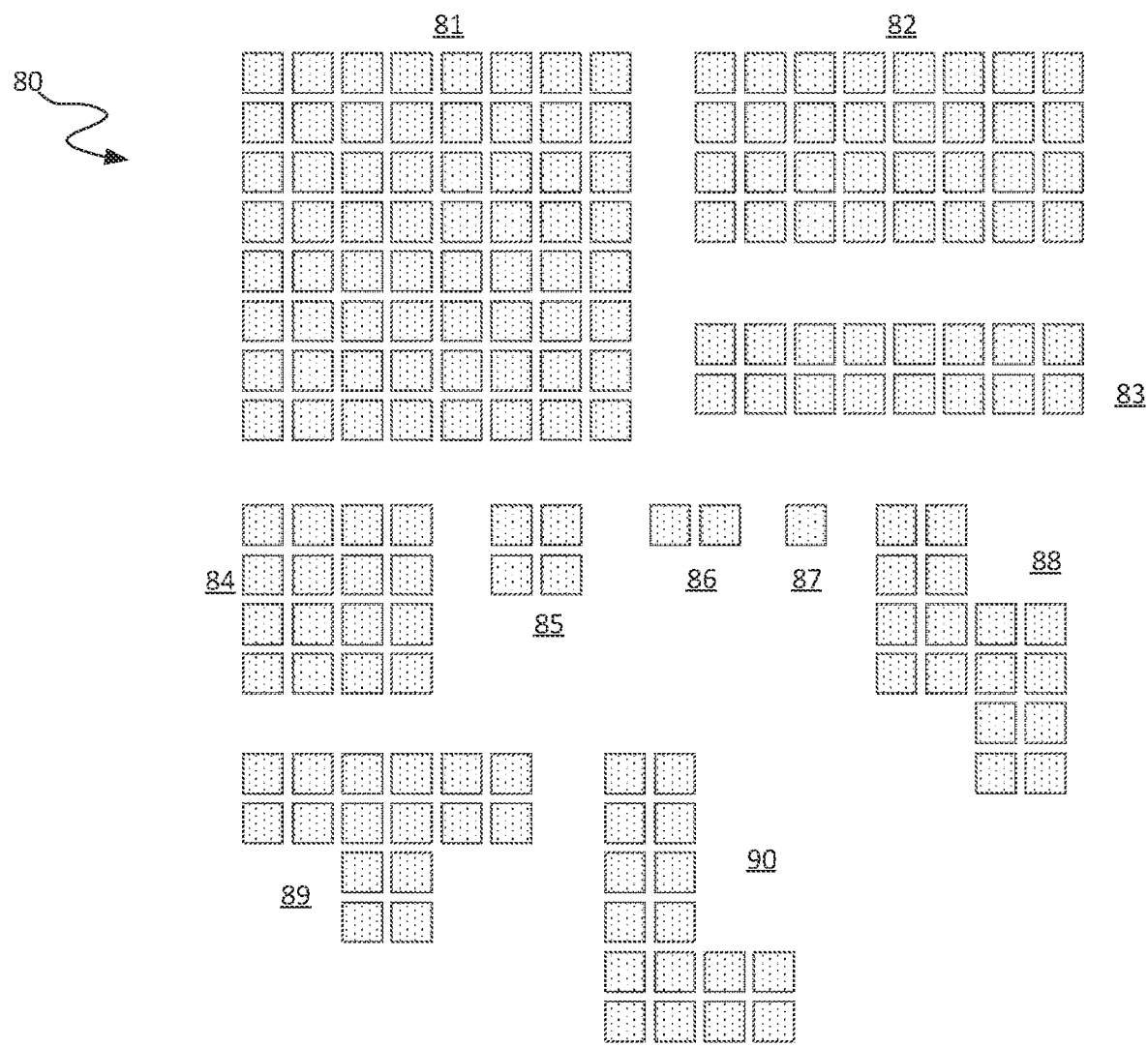
FIG. 8 shows a number of exemplary shot arrays that may be used to expose a substrate.

Once all groups on a substrate 100 are identified, one turns to step 604 wherein exposure fields of view, referred to hereafter as 'shots', are mapped onto the respective groups of devices 104 identified at step 602. FIG. 8 illustrates a number of possible shots 80 that may be projected onto the devices 104 on substrate 100 during exposure. Each shot 80 includes one or more patterns to be projected onto devices 104. The patterns of each shot 80 form arrays that align with a nominal device 104 alignment. Where the alignment of devices 104 is quite good, a large shot array such as array 81 exposes a large number of devices simultaneously. Smaller shots 80 better match the alignment of smaller groups of devices 104. For example, array 87 includes a single pattern used to expose a single device 104.

Shots 80 are preferably regular, rectilinear arrays of patterns. Each of the arrays 81-90 may be wholly formed on a reticle and exposed as is after alignment to the devices 104. The shot arrays may also be formed by reducing the size of larger arrays using masking devices, blades, spatial light modulators or the like (not shown). For example, arrays 82 and 83 may be formed by masking off ½ and ¾, respectively, of array 81. More complex shapes such as arrays 88, 89, and 90 may be formed into the same or a different reticle as the one that includes array 81. The efficient arrangement of arrays on reticles is known to those skilled in the art. Lithography system 300 includes a reticle chuck 332 for alignment, handling, changing, and/or masking one or more reticles 334. Multiple reticles may be used to establish a larger number of shots 80.

Figure 9:
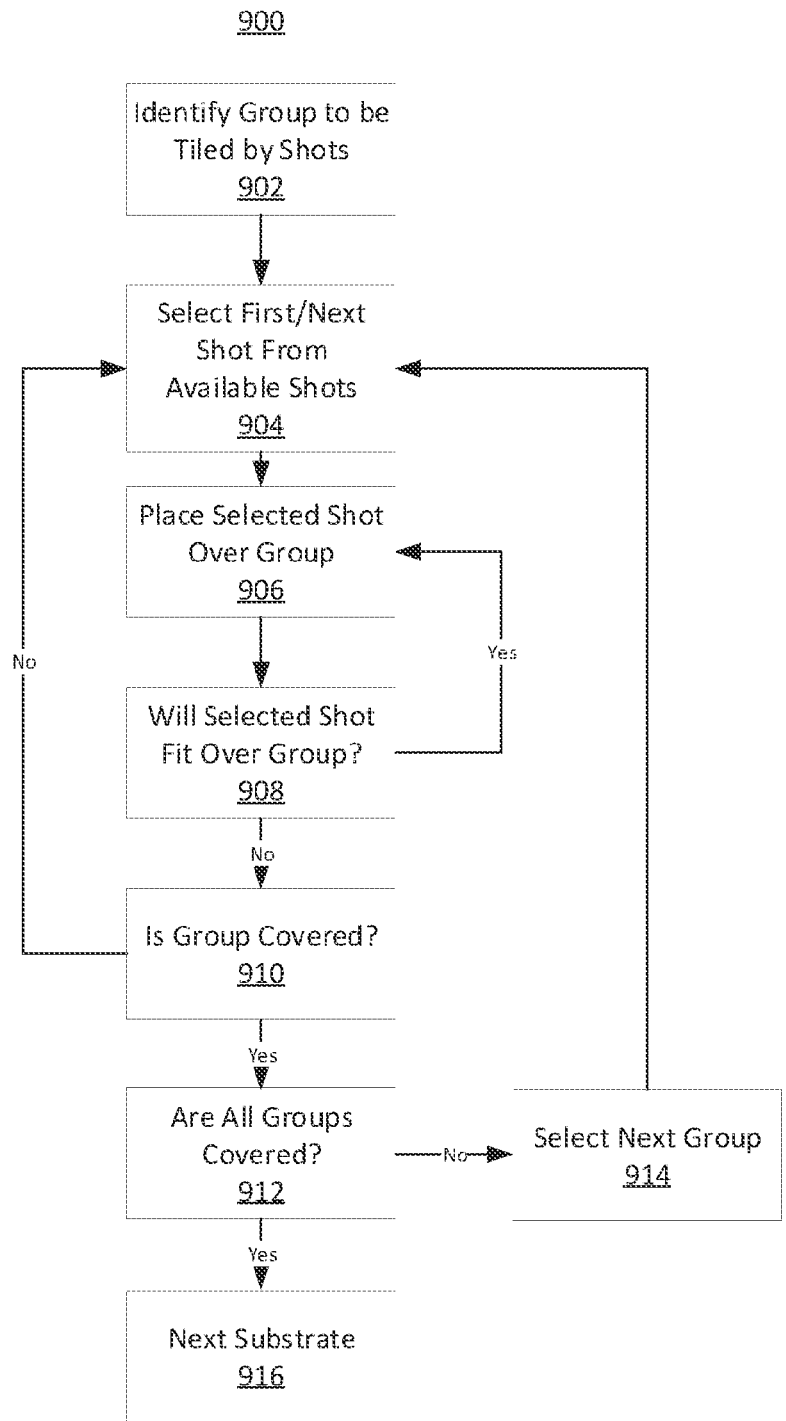
FIG. 9 shows a method of tiling fields of view over a substrate for lithographic processing.

One embodiment of a process for mapping shots 80 onto the devices of a substrate 100 can be modelled as a tiling or 2D packing problem. A more detailed example of one suitable method for carrying out step 604 is shown by method 900 in FIG. 9. For the purposes of this application it is to be understood that the term 'tiling' can be used as both a noun and a verb. In its action sense, tiling refers to the process of fitting arrays of images (shots 80) projected by the projection camera 310 onto respective devices 104 such that all or substantially all of the devices 104 are exposed, simultaneously or ad seriatum. This process of tiling is simple where all devices 104 on a substrate 100 share a single alignment. But where the alignment of devices 104 differs, it is necessary to tile the projections from the projection camera 310 onto devices 104 or groups of devices 104 that have matching or at least sufficiently similar alignments. In its proper noun sense, the term 'tiling' refers to the arrangement of differently sized and/or aligned projects or shots over the devices 104 of a substrate 100.

A tiling may be formed manually by a user who selects shots that align well with a selected set or group of devices 104. However, this manual process is slow and a user is unlikely to be able to conduct an optimization of tilings in any reasonable amount of time. Manual tilings, complete or partial, are useful where more automated systems fail to arrive at solution or where practical considerations suggest that an automatically generated tiling should be modified.

Shots 80 are tiled over the groups identified at step 902 by identifying the first group of devices that is to be tiled as at Step 902. A first shot 80 is selected from the set of all available shots (for example shots 81-90) at step 904. The group and the shot selected at steps 902 and 904 may be considered initial conditions for this process. By varying or perturbing these initial conditions, it is possible to modify the outcome of the tiling process itself. Perturbing the initial conditions may involve arbitrarily selecting a shot 80 that is to be applied to an arbitrarily selected group of devices 104. What is more, the groupings identified at step 602 may also be modified as described hereinabove. While the first shot 80 may be arbitrarily selected, it is preferred to sort the shots 80 that are available in a predetermined order. This can be based on any desired characteristic, but a descending sort by size is useful. As the efficiency of an exposure operation is directly proportional to the size of the shot 80, it is desirable to ensure that larger and fewer shots 80 are used to tile the groups identified in step 602. Accordingly, one will preferably start with the largest shot 80 from the set of all available shots.

The tiling process continues at step 906 by attempting to fit the selected shot 80 into the selected group. Determination of whether the shot 80 will fit within the group of devices is made at step 908. This can be done in a number of ways including by modelling the shot 80 and the devices 104 in the group as polyominoes. The polyomino modeled shot 80 can be rotated and/or translated until a shot 80 orientation and size that fits over the remaining devices 104 is identified. This filling or fitting process continues so long as the shot 80 will fit over the group of devices. Where the shot 80 will not fit onto the group of devices 104, step 910 determines whether the group of devices has been fully covered. Where the group is not fully covered by shots 80, the process moves back to step 904. In this circumstance a different shot 80 is selected and the fitting process proceeds to step 906. Note that where the set of available shots 80 has been sorted on size, this next shot 80 will be the next smallest shot 80, though as mentioned above, it is always possible to select an arbitrary one from the available set of shots 80. This process continues until all or substantially all of the devices in a selected group are covered by shots 80. Step 910 considers whether the group has been covered and where this is the case, the process moves to step 912 which considers whether all of the groups identified in step 902 have been covered. Where groups remain uncovered, step 914 moves the process onto the next group of devices. Where all groups have been covered, process 900 moves on to a subsequent substrate, if any, at step 916. More formalized tiling algorithms may also be used to generate tilings of the groups of devices 104.

A score can be computed for the tiling of shots 80 over the groups of devices on substrate 100. This score may be used for determining whether a threshold value for the tiling has been achieved or may be used for optimization by comparing successive iterations of the result of process 900. One score that may be used would be to merely count the number of shots 80 that are used to cover the devices of substrate 100. As will be understood, larger shots 80 tend to be more efficient and so fewer shots 80 in a tiling will be considered to be a more efficient tiling. Another score may involve taking into consideration a cost associated with each shot 80 used to cover the devices of substrate 100. For example, a weight may be assigned to each shot array size so that more inefficient tilings will be scored higher than more efficient ones. In this example a multiplier that is inversely proportional to size may be applied to the count of each shot array size. The score is accordingly increased faster by smaller shot array sizes than by larger shot array sizes. Other costs may be applied in a similar fashion. For example, it is arguably simpler to use shots 80 that have a regular rectangular shape. More complex shot array shapes such as shots 88, 89, and 90 in FIG. 8 may require complex masking operations or even an additional reticle that may be changed.

In this instance, while the use of such complex shapes may assure more accurate alignment of shots in some situations, the use of these more complex shapes may be disfavored due to the added time required to employ these shot array shapes. A score might then be: score=Σ(cost×count of each shot array size). This score can be compared to a threshold value as where any tiling having a score below a predetermined, set threshold value is immediately acceptable. Alternatively, this score can be recorded and used for optimization purposes.

In one embodiment, a score equal to the total number of shots 80 required to expose an entire substrate 100 is established. Thereafter, the grouping process described above is re-run starting with different initially selected groups of device(s) 104. Shots 80 are fit to the subsequent groups and a new score is recorded. This process continues for a predetermined number of iterations or until some threshold score is achieved. In this embodiment, the lowest score (fewest shots) identifies an optimal solution. In another embodiment, a score based on the total number of shots and the complexity of each shot is generated. This type of score could involve summing the total number of line segments required to bound each shot 80. Given that regular arrays having square and rectangular shapes are easier to expose, fewer boundary line segments may indicate a simpler and more efficient solution. In yet another embodiment, a score for each tiling of shots 80 may be formed of a composite of the number of shots, the number of devices in each shot, and the number of line segments required to bound each shot. The idea here being that fewer and larger shots with simpler, more regular shapes are preferable to shots that are more numerous, with fewer devices per exposure and more complex masking requirements.

In one embodiment, the optimization of tiling shots 80 onto the devices 104 of a substrate 100 can be characterized as a branch and bound optimization problem. In this instance process 900 is conducted a number of times, in each instance some variation in the starting conditions or how shots are selected may be used to generate alternative tiling solutions for a given substrate 100. Each of the alternative tiling solutions are scored and compared. This type of optimization may be undertaken for any given group of devices or for any desired shot array size or configuration. Optimization continues until an arbitrary limit on the time or number of iterations has been reached, whereupon the best solution is selected. Alternatively, optimization continues until some predetermined threshold is met. Such a threshold may be based on an objectively determined score or may be based heuristically on the experience of the user of the system 300. Yet another optimization limit may be the identification of a minima value (local or global).

The next step in process 600 is to determine a path for exposing devices 104 on substrate 100 using the tiling determined at step 604. This path finding step 606 may be characterized as a traveling salesman type problem, though preferably some simplifications will be used to reduce the computational overhead that can be involved in identifying an optimal path. One approach to determining a path for the exposure of the substrate is to use the greedy heuristic. The greedy heuristic involves always selecting as the next path segment the segment that has the lowest cost. As with the optimization of the tiling of shots 80 onto the substrate 100, the cost may include an objective distance measurement as well as a time factor related to overhead incurred by the modification of alignment, changing reticles, or masking the shot arrays on the reticle. This process continues until a recipe in which all shots 80 will have been visited and exposed is generated.

Optimization of the path used for exposure may again be conducted using a branch and bound approach. Note that other optimization techniques may be used as well. In implementing a branch and bound approach, the greedy heuristic will be interrupted to cause a less optimal choice to be made at some point along the developing path. In perturbing the greedy heuristic, different local minima/maxima paths may be identified. This may be implemented by simply starting from a number of different initial shots 80. Alternatively, at any point during the development of a path using the greedy heuristic, a more costly path segment may be selected, the greedy heuristic being used again after the perturbation. In each case a score is determine for comparison and optimization purposes as described above. Regarding paths, the key characteristic to be minimized is time. In this instance, a score may take the form of a summary of the travel time from one shot 80 to another, together with an accounting of additional time that may be incurred, such as time needed to mask or change a reticle or modify an alignment of a shot 80 to match the devices 104. The scores for paths generated using a branch and bound type optimization approach are compared and an optimal value is selected. As discussed above, the first path that satisfies a predetermined time threshold, the best scored path obtained within a set time or computation limit, or a local or global minima or maxima may be selected as the optimal path.

By way of further example, the establishment of a recipe for exposing a semiconductor substrate 100 is an iterative process. The tiling process, whereby groups of similarly aligned devices 104 are identified may be conducted a large number of times, each iteration resulting in a different grouping of devices 104. Tilings may be performed for each of the different groupings so that each grouping of similarly aligned devices has a shot 80 fit thereto. Again, multiple tilings may be generated for each of the respective groupings. Further, multiple paths may be generated for each of the multiple tilings. In order to identify an optimal recipe, scores are generated for the tilings and the paths. These scores may also be generated as composites of the respective scores for the tilings and paths. As one may appreciate, this process can be costly in terms of computing power. As a result, it is often desirable to arbitrarily limit the number of iterations numerically (e.g. no more than ~500 iterations) or chronologically (e.g. no more than ~5 minutes of computation). One may also set a threshold for the scores that, once met by a prospective recipe, will termination the establishment process.

The above identified steps 604 and 606 may each be optimized separately. It is also possible to optimize these steps together, particularly where these steps are conducted in succession. For example, a path may be determined for a newly generated tiled arrangement of shots 80 whereafter a second tiled arrangement of shots 80 is determined along with an associated path. Because the number of shots 80 in a given tiling is directly related to the time required to follow a path that visits each of these shots, the path score can be used to identify a suitable tiling/path for use in a lithography recipe. And, as suggested above, yield and throughput may also be used to generate a revenue based score.

Figure 10:
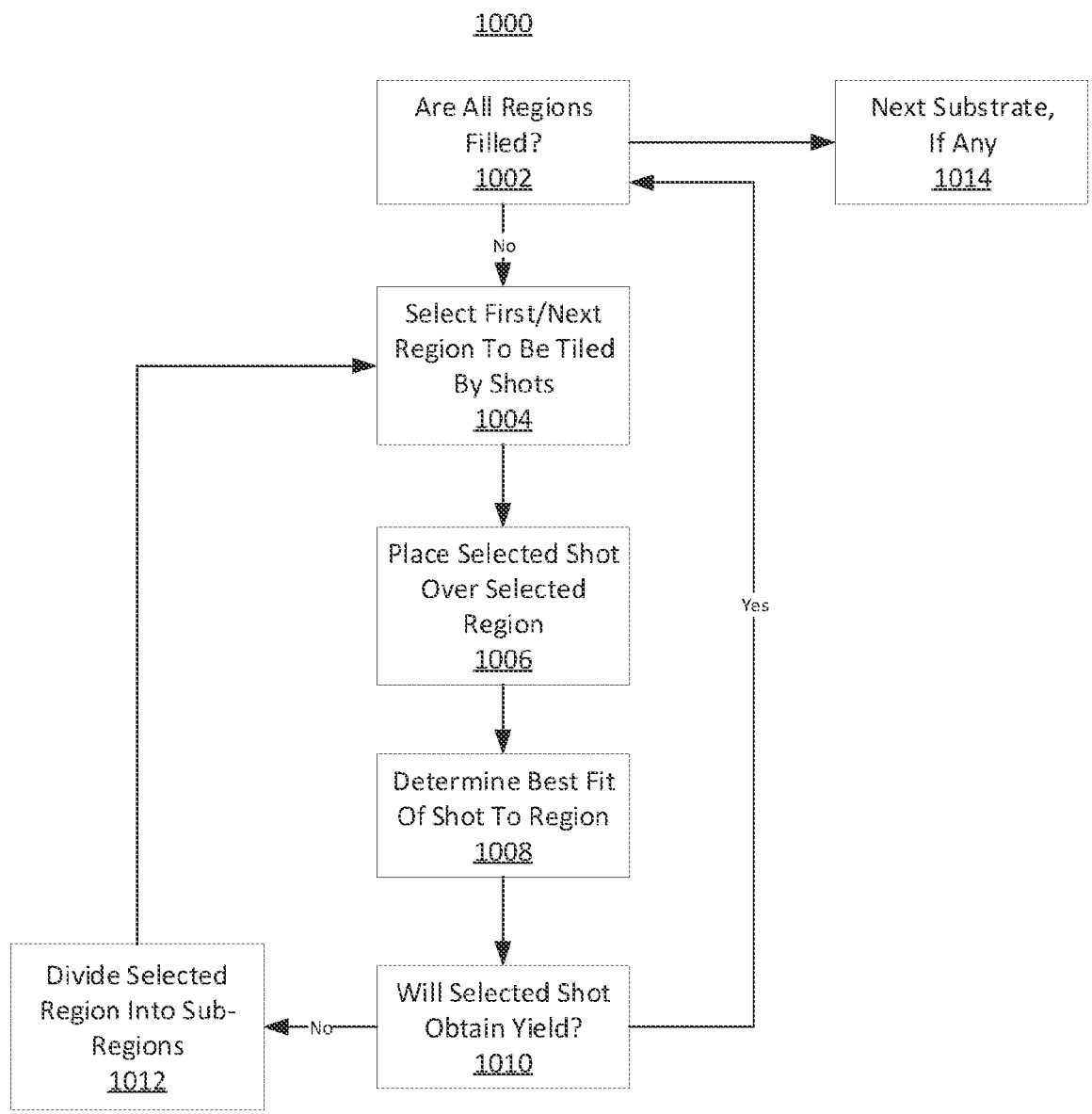
FIG. 10 shows a method for generating a recipe for lithographic processing.
Figure 11A:
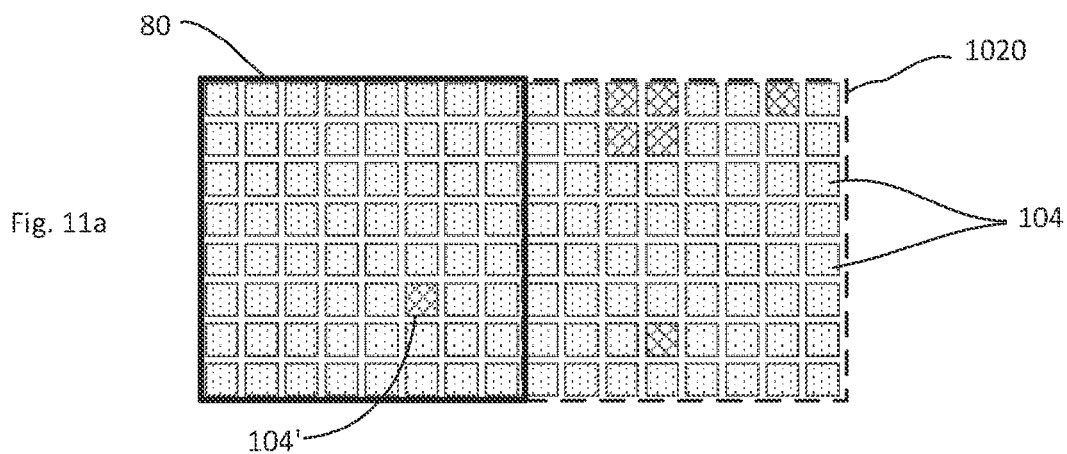
FIGS. 11a-11d show the application of a shot to a region of a substrate.
Figure 11B:
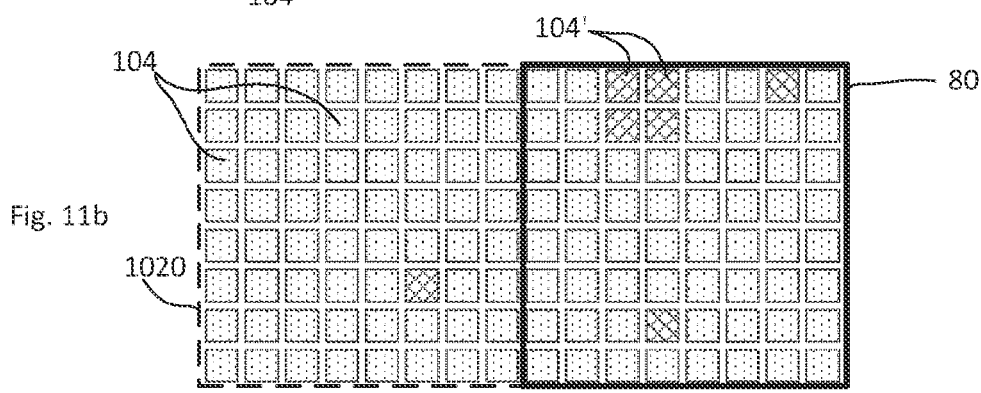

Another method for generating a recipe for lithographic processing is illustrated in FIGS. 10 and 11. The general method 1000 of this approach is shown in FIG. 10. This method omits the concept of grouping devices by alignment described above and instead proceeds directly to tiling shots 80 onto the devices 104 of a substrate 100. As used in this methodology, the term 'region' applies to an area that is to be covered by a shot 80. Regions are generally the same size as a shot 80 that is being aligned thereover, but since a region may be subdivided, the term should not be taken as being identical to the term shot or field of view. The method 1000 starts with a preliminary step 1002 in which it is determined whether the region has been tiled as yet. One will appreciate that this step is a logical step used to ensure that the tiling process ends when completed. Where regions remain to be tiled, the first, or perhaps next, region is selected at step 1004. A shot is then selected that has a largest area that may be applied to the selected region for best throughput. The selected shot is then figuratively placed over the region at step 1006 and the best fit of the selected shot to its region is determined at step 1008. Based on the determined best fit, a projected yield for the combination of the region, shot and fit is computed at step 1010. The projected yield is an assessment of whether the patterns that make up a shot are sufficiently well aligned to reasonably output an IC device of acceptable quality. In one embodiment, this projected yield assessment is done on a device by device basis over the entire shot and the percentage of the total number of devices 104 that satisfy predetermined alignment criteria or requirements are tallied. Using this tally, one determines a cumulative projected yield for a shot and where this projected yield is acceptable, the region is considered to have been successfully tiled/aligned and the shot is recorded for use as part of an exposure recipe. Once a successful shot is identified, the shot is established as part of the recipe and the process will move back to step 1002 to determine if all regions of a substrate 100 have been tiled. Where all regions have been tiled, the process would proceed to the next substrate, if any, at step 1014. FIGS. 11a and 11b illustrate the application of a shot 80 to a region 1020 wherein alignment/yield is acceptable. Within the shot 80 in FIG. 11a, alignment for only a single device 104' is considered to be out of specification, and accordingly, the yield is relatively high at approximately 98%. As a result, the region 1020 to which the shot 80 was applied in FIG. 11a is considered to have been successfully tiled and the process has moved to a subsequent region 1020 as seen in FIG. 11b.

Where a given combination of region, shot, and alignment does not meet predetermined yield requirements, the process 1000 will proceed from step 1010 to step 1012 in which the selected region is divided into one or more sub-regions. As seen in FIG. 11b, a relatively larger number of devices 104' are not within alignment specifications. In this example, the yield would be approximately 90%. Assuming that this yield value is not acceptable (for example, where a yield threshold has been predetermined to be approximately 92%), region 1020 will be divided into ever smaller sub-regions until the yield threshold is satisfied. This is accomplished by iterating steps 1004 to 1012 until a desired yield value is obtained.

Figure 11C:
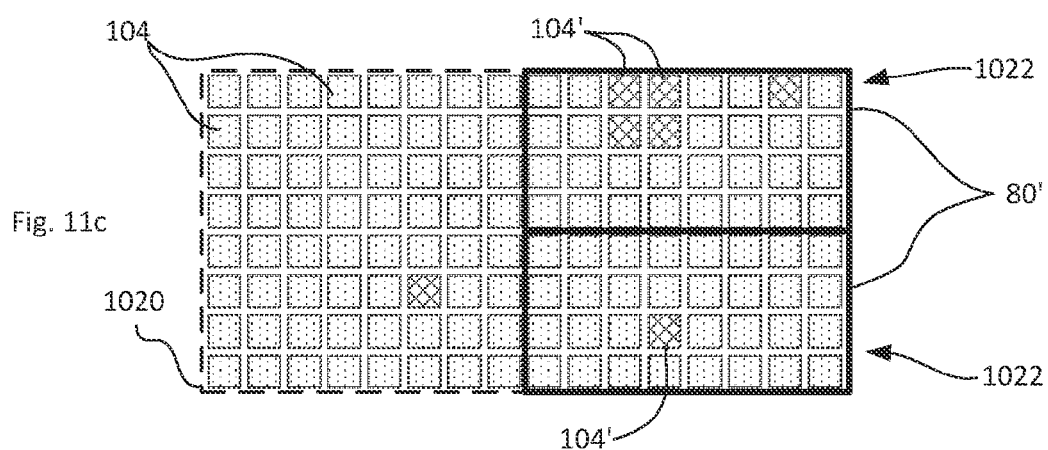

Step 1012 involves the division of a shot 80 into one or more small shots 80' that cover the region 1020. As mentioned above, it is desirable to start process 1000 using the largest shots that may be applied to the region 1020. This is due to the relative efficiency of using a larger shot. In FIG. 11c the first selected shot is replaced with two smaller shots 80'. Note that any of the shots 81-90 shown in FIG. 8, or the like, may be used as part of process 1000.

Figure 11D:
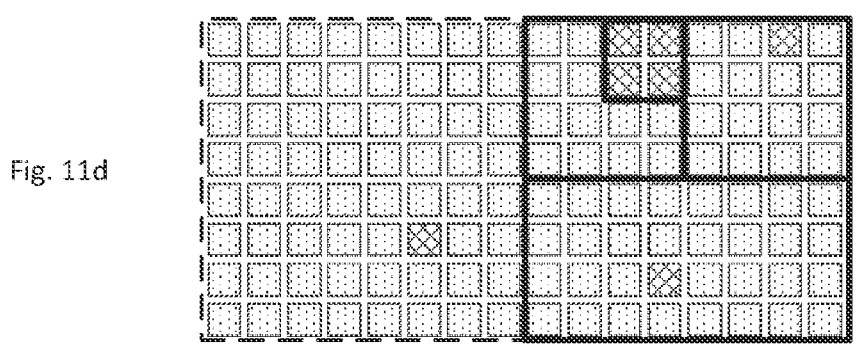

As seen in FIG. 11c, the upper shot 80' covering the sub-region 1022 has a yield of approximately 84%, which is below the exemplary threshold of 95%. Lower shot 80', covering another of the sub-regions 1022, has a yield of approximately 97%. As a result, the lower sub-region 1022 will be accepted as having been successfully tiled whereas the upper sub-region 1022 will be further subdivided at step 1012. This process continues as shown in FIG. 11d wherein all regions and sub-regions have been tiled with selected shots such that each shot has a yield, based on alignment, of more than the predetermined yield threshold.

In one embodiment, a heuristic may be applied to further increase the throughput of the system 300. For example, the upper right-most subregion 80' in FIG. 11d includes a 4×4 array of devices 104, one of which cannot be well aligned with the remainder of the devices when addressed by a 4×4 shot. Were the yield threshold set to 95%, this sub-region would be again sub-divided until there was agreement between the region/sub-region, shot, their alignment, and the yield threshold. This could result in multiple extra shots, thereby reducing throughput. A separate logical loop may be applied to the process of FIG. 10 to assess whether one or more devices 104' can be written off in the interests of increasing the throughput of the system 300. For example, given a yield threshold for a substrate 100 of 95%, so long as the total yield of the substrate 100 is maintained, otherwise good devices 104' that are hard to accord with their surrounding devices 104 might be discarded to reduce the number of shots required to fully expose the substrate 100. This would increase the throughput of the system 300 whilst maintaining the yield requirements. Note that this type of heuristic may be applied on an ongoing basis each time a region is subdivided into sub-regions (ceasing when the yield threshold was passed) or globally after the entire substrate has been tiled with shots 80. Other such heuristics may also be applied to modify the yield or the throughput or some combination of the two. This type of heuristic may incorporate relative value of various devices 104 based on some quality metric/desired end use or even where more than one type of IC device 104 is included on the substrate 100.

Those skilled in the art will appreciate that solving a difficult problem such as tiling fields of view or exposure shots over groups of devices from first principles each time the problem is proposed is resource intensive. One way to eventually reduce the computational work load is to retain solutions to the field of view tiling solutions as they are generated for each substrate. This technique, referred to as dynamic programming, allows one to use previously generated solutions as opposed to computing new solutions each time. Assuming that the systematic error in the alignment of devices on a substrate is similar from substrate to substrate in a lot of substrates, a tiling solution for arranging fields of view over the devices of a first substrate should provide at least partial solutions for the tiling of fields of view over the devices of subsequent substrates. Random error in the alignment of devices on successive substrates can be accommodated by generating alignment solutions for an optimal field of view or fields of view in those regions where pre-existing solutions to the alignment problem do not meet established criteria.

In practice, one embodiment of invention may involve using a preexisting alignment recipe as a starting point. In this approach, each preexisting field of view size, shape, and orientation may be tested against the alignment information of the devices on the substrate under analysis. Where a preexisting field of view does not satisfy predetermined alignment criteria for the devices of the substrate under analysis, those devices are set aside and the process proceeds to the next preexisting field of view. This process continues as described until all preexisting fields of view have been tested with respect to the devices of the substrate under analysis. Where all assessed fields of view satisfied the predetermined criteria, the preexisting recipe, which includes field of view size, shape, and alignment information, can be used for the exposure of the substrate under assessment. Where devices have been set aside, alignment algorithms as described above are used to determine acceptable alignments and fields of view for the remaining devices. The process continues until all devices 104 are tiled with a properly aligned field of view. Note that in some instances, as suggested above, one or more devices may be omitted entirely from the exposure process so long as doing so for the entire substrate satisfies predetermined criteria for alignment and for yield.

In addition to using a preexisting alignment recipe of a first substrate to arrange or perhaps pre-solve some alignment issues for successive substrates, one may use an established library of alignment and field of view arrangement solutions. While it is likely that only substantially similar substrates, e.g. substrates from similar or identical lots or product families which have the same size, pitch, and device dimensions, may prove useful for determining alignment in a dynamic processing, alignments of even disparate substrates may be provide alignment solutions for some or even all devices on a substrate.

Figure 12:
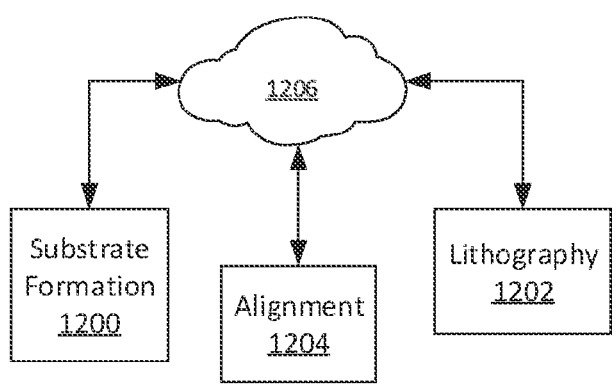
FIG. 12 illustrates a cloud communication arrangement for carrying out the present invention.

FIG. 12 illustrates a cloud communication arrangement for carrying out the present invention in accordance with one embodiment. In use, data flows to and from system (or tools or mechanisms) 1200 for forming substrates, system 1204 for conducting inspection and determining alignments of devices on substrates, and system 1202 for performing lithography on the substrates. While direct connections between systems 1200, 1202, and 1204 are possible, it is preferable to utilize standard networking or cloud communication systems 1206 to facilitate communication. Further, by using a cloud arrangement such as that illustrated, the systems 1200, 1202, and 1204 may be geographically remote from one another. Given that substrates 100 may be transferred geographically for processing at different facilities, systems 1200, 1202, and 1204 may perform functions in a temporally spaced apart fashion as well. As mentioned elsewhere in this application, data may be recorded in any useful format, though XML is often preferred.

Systems, apparatuses, and methods described herein may be implemented using digital circuitry, or using one or more computers using well-known computer processors, memory units, storage devices, computer software, and other components. Typically, a computer includes a processor for executing instructions and one or more memories for storing instructions and data. A computer may also include, or be coupled to, one or more mass storage devices, such as one or more magnetic disks, internal hard disks and removable disks, magneto-optical disks, optical disks, etc.

It will be appreciated that the tools and apparatuses used in the formation of IC devices on substrates at most all points in their processing are largely computer controlled. And, while these apparatuses may each function independent of one another, it is generally the case that these apparatuses are connected by means of various types of networks. In this way, their operation can be remotely controlled and monitored. Manual input of data and instructions to these apparatuses, while possible, is deprecated in favor of the use of automated recipe creation methods and even the repurposing of pre-existing recipes from similar, pre-existing substrates or products. In a more preferred embodiment each apparatus involved in the measurement of alignment of devices 104 on a substrate 100, in the placement of devices 104 into a molding for the formation of composite substrates, or the exposure of devices 104 as part of the lithography process has a computer associated therewith that handles the operation of the apparatus itself and which also handles communications/data transfer with other computers, servers, networks, database, storage media, or cloud based computing systems over standard or to be implemented communications systems. Remote computers or systems may coordinate the operation of the aforementioned apparatuses to produce efficiently integrated circuit devices 104. In one embodiment, a server connected to network maintains a repository of recipes, which, as mentioned above, are sets of instructions for operating the apparatuses individually or in conjunction with one another. A recipe may be represented electronically in any useful format, however it has been found that XML and various TXT file formats are useful.

In addition to recipes, which are typically used to instruct apparatuses in the processing of multiple substrates 100, the various computers associated with the apparatuses in a local or distributed manner may create, modify and retain results files that relate data about individual substrates 100. These results files may constitute centralized databases or individual computer files. In either case, as substrates 100 are processed, the database or individual computer files are updated. These databases or computer files may include data such as textual, numerical, and/or image data concerning each substrate 100. The data may relate to the substrate 100 as a whole, to individual devices 104 or groups of devices 104, to individual processes that were carried out with respect to the substrate, device, or groups of devices. At the users' discretion, a result files may include a complete record of everything that has been done relative to a device 104 from creation to completion. As always, other variations on this concept may be used. Of import is the fact that results files may be used to record the alignment of individual devices 104 of a substrate 100. These alignments may be used by various computers that are part of or connected to a system to carry out any of the foregoing methods or processes. These results files may be used iteratively to record the progress of a substrate 100 and its devices 104 as they are repeatedly processed by apparatuses.

Figure 16:
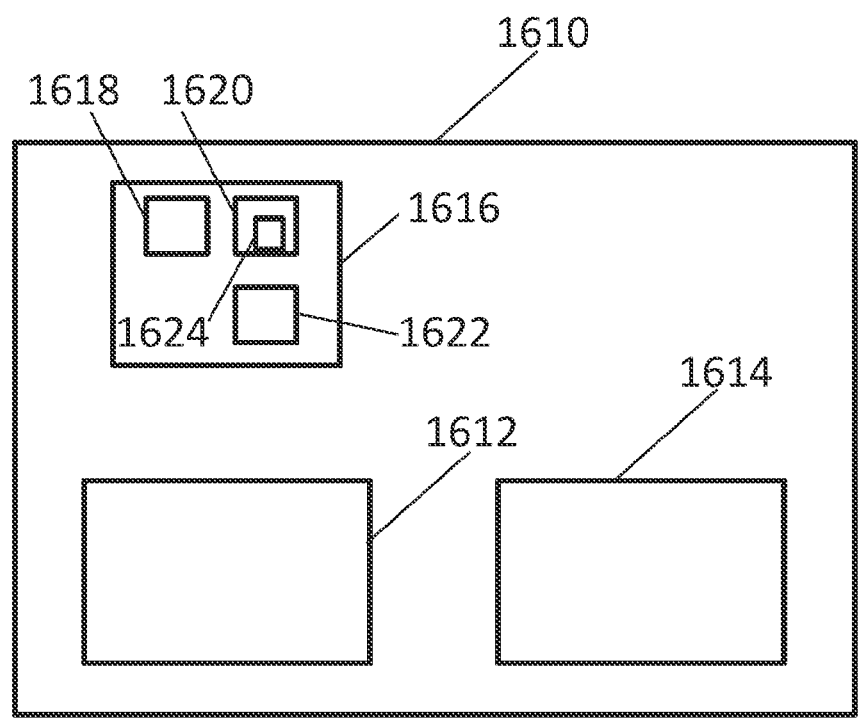
FIG. 16 illustrates a system for lithographic processing.

FIG. 16 illustrates a system for lithographic processing. The system 1610 includes an inspection system 1612 and a lithography system 1614. The inspection system 1612 and the lithography system 1614 work as described herein. Computing unit 1616 includes a processor 1618, a memory 1620, input/output device 1622, and software 1624. The processor 1618 can be one processor or multiple processors as well as a specialized processor. The memory 1620 is a computer readable medium such a random access memory (RAM), read-only memory (ROM), disk drives, and solid state drives or any combination of these. The input/output device 1622 includes an interface for communicating with inspection system 1612, lithography 1614, and with users through the use of keyboards, mouse, or other input devices as well as screens for displaying information. The software 1624 includes executable files, firmware, and/or instructions that can be run on processor 1618. The mapping software that calculates markers for devices on the substrate and the overlay errors can be part of software 1624. The software 1624 can also include instructions for operating the inspection system 1612 and lithography system 1614. The inspection system 1612 and the lithography system 1614 can communicate data and instructions with the computing unit 1616, which can receive them through its input/output device 1622.

Figure 17:
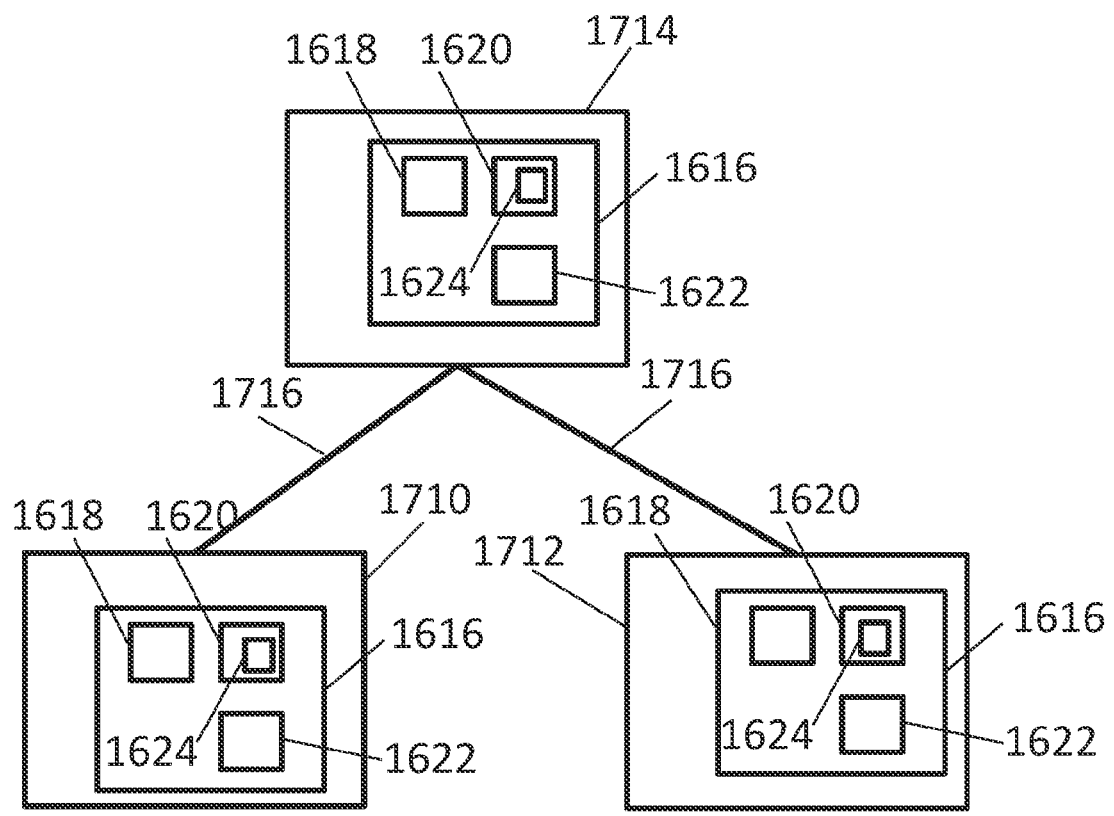
FIG. 17 shows a distributed system for lithographic processing.

FIG. 17 shows a distributed system for lithographic processing. The distributed system includes inspection system 1710, lithography system 1712, server 1714, and communication lines 1716. The inspection system 1710 and lithography system 1712 work as described herein and each includes a computing unit 1616 as described herein. The server 1714 includes computing unit 1616 and can be used to run and store the mapping software that calculates markers for devices on the substrate and the overlay errors. The server 1714 can be part of a cloud computing system, a remote server, or a local server. The inspection system 1710 and the lithography system 1712 can communicate data and instructions over communication lines 1716. The data can include measurements from the inspection system 1710 and mapping information for the lithography system 1712. Instructions on the adjustments to make for overlay correction can also be sent over the communication lines 1716 in some embodiments. In other embodiments, computing unit 1616 in lithography system 1712 can generate the adjustments for the lithography system to make for the overlay corrections.

Computers that form part of or which are connected to the system may include both general and special purpose microprocessors or central processing units (CPUs), which may be used singly or in combination with one another in any suitable linear or parallel arrangement. Data storage devices such as random access memory (RAM), read-only memory (ROM), disk drives, solid state drives, and the like of various types and quantity are connected and used in the normal course as understood by those skilled in the art. Input/output devices such as a keyboard, mouse, tablet, printer, scanner, display screen, etc. are similarly included and used in their well understood capacities.

The foregoing Detailed Description is to be understood as being in every respect illustrative and exemplary, but not restrictive, and the scope of the invention disclosed herein is not to be determined from the Detailed Description, but rather from the claims as interpreted according to the full breadth permitted by the patent laws. It is to be understood that the embodiments shown and described herein are only illustrative of the principles of the present invention and that various modifications may be implemented by those skilled in the art without departing from the scope and spirit of the invention. Those skilled in the art could implement various other feature combinations without departing from the scope and spirit of the invention.

The invention claimed is:

1. A method for correcting overlay errors in a lithographic process, comprising:
   exposing a first set of devices on a substrate;
   adjusting a reticle in a vertical direction for a magnification adjustment to minimize an overlay error with a second set of devices on the substrate based on alignment information associated with the substrate;
   adjusting a stage that holds the substrate while adjusting the reticle to minimize the overlay error with the second set of devices on the substrate; and
   exposing the second set of devices on the substrate after adjusting the reticle and the stage.

2. The method of claim 1, wherein adjusting the reticle involves a rotation adjustment theta.

3. The method of claim 1, further comprising:
   adjusting the reticle to make a rotation adjustment theta; and
   adjusting the stage to make X and Y adjustments based on the adjusting of the reticle.

4. The method of claim 1, wherein a recipe controls the adjusting the reticle and the adjusting the stage.

5. The method of claim 1, further comprising adjusting independently a scale to a zone, and a magnification to individual exposure sites within the zone.

6. The method of claim 1, wherein the adjusting the reticle and the adjusting the stage is performed at a package level.

7. The method of claim 1, wherein the magnification adjustment is performed simultaneous to adjusting the stage, wherein the magnification adjustment is completed before the adjustment of the stage is completed.

8. The method of claim 1, wherein the magnification adjustment is performed by adjusting a piezo actuator within a lens to adjust a per site magnification correction.

9. An apparatus configured to correct overlay errors in a lithographic process, comprising:
   means for exposing a first set of devices on a substrate;
   means for adjusting a reticle in a vertical direction for a magnification adjustment to minimize an overlay error with a second set of devices on the substrate based on alignment information associated with the substrate;
   means for adjusting a stage that holds the substrate while adjusting the reticle to minimize the overlay error with the second set of devices on the substrate; and
   means for exposing the second set of devices on the substrate after adjusting the reticle and the stage.

10. The apparatus of claim 9, wherein adjusting the reticle involves a rotation adjustment theta.

11. The apparatus of claim 9, wherein the means for adjusting the reticle makes a rotation adjustment theta; and
   the means for adjusting the stage makes X and Y adjustments based on the adjusting of the reticle.

12. The apparatus of claim 9, wherein a recipe controls the means for adjusting the reticle and the means for adjusting the stage.

13. The apparatus of claim 9, wherein the means for adjusting the reticle adjusts a magnification within exposure sites of a zone independently of a scale adjustment for the zone.

14. The apparatus of claim 9, wherein adjusting the reticle and adjusting the stage is performed at a package level.

15. An apparatus configured to correct overlay errors in a lithographic process, comprising:
   a light source that is configured to expose a first set of devices on a substrate;
   a reticle chuck that is configured to adjust a reticle in a vertical direction for a magnification adjustment to minimize an overlay error with a second set of devices on the substrate based on alignment information associated with the substrate; and
   a stage that holds the substrate and that is configured to adjust while the reticle is adjusted to minimize the overlay error with the second set of devices on the substrate;
   wherein the light source is configured to expose the second set of devices on the substrate after adjusting the reticle and the stage.

16. The apparatus of claim 15, wherein the reticle chuck is configured to adjust a rotation theta; and the stage is configured to make X and Y adjustments based on the reticle chuck adjustment.

17. The apparatus of claim 15, wherein the reticle chuck is configured to make a rotation adjustment theta.

* * * * *